US005469099A

United States Patent [19]
Konishi

[11] Patent Number: 5,469,099
[45] Date of Patent: Nov. 21, 1995

[54] POWER-ON RESET SIGNAL GENERATOR AND OPERATING METHOD THEREOF

[75] Inventor: Yasuhiro Konishi, Hyogo, Japan

[73] Assignee: Mitsubishi Denki Kabushiki Kaisha

[21] Appl. No.: 45,387

[22] Filed: Apr. 13, 1993

[30] Foreign Application Priority Data

Jun. 17, 1992 [JP] Japan .................. 4-157986

[51] Int. Cl.$^6$ .................................................. H03K 5/13
[52] U.S. Cl. .................. 327/198; 327/143; 327/544
[58] Field of Search .................. 307/296.4, 296.5, 307/296.6, 296.8, 272.3, 362, 296.2; 327/142, 143, 198, 77, 538, 543, 544

[56] References Cited

U.S. PATENT DOCUMENTS

| | | | |
|---|---|---|---|
| 4,210,829 | 7/1980 | Wong et al. | 307/292.3 |
| 4,717,840 | 1/1988 | Ouyang et al. | 307/362 |
| 4,788,454 | 11/1988 | Tanagawa et al. | 307/272.3 |
| 4,788,462 | 11/1988 | Vesce et al. | 307/296.4 |
| 4,849,654 | 7/1989 | Okada | 307/272.3 |
| 4,874,965 | 10/1989 | Campardo et al. | 307/272.3 |
| 4,902,910 | 2/1990 | Hsieh | 307/296.4 |
| 5,073,874 | 12/1991 | Yamada et al. | 307/272.3 |
| 5,166,546 | 11/1992 | Savignac et al. | 307/272.3 |
| 5,172,012 | 12/1992 | Ueda | 307/594 |
| 5,177,375 | 1/1993 | Ogawa et al. | 307/362 |

FOREIGN PATENT DOCUMENTS

| | | |
|---|---|---|
| 0079333 | 5/1983 | Japan .................. 307/272.3 |
| 59-31083 | 7/1984 | Japan . |
| 63-28058 | 2/1988 | Japan . |
| 63-314914 | 12/1988 | Japan . |

OTHER PUBLICATIONS

IBM. Technical Disclosure Bulletin. vol. 27 No. 11 Apr. 1985.
IBM Technical Disclosure Bulletin. Reset Circuit For Microprocessors vol. 28, No. 11, Apr. 1986.

Primary Examiner—Timothy P. Callahan
Assistant Examiner—T. Lam
Attorney, Agent, or Firm—Lowe, Price, LeBlanc & Becker

[57] ABSTRACT

A first signal generation circuit generates a signal which rises from the ground level to a second level when a prescribed time elapses after an external supply potential starts to rise from the ground level to a first level. A second signal generation circuit outputs a power-on reset signal which falls when the signal outputted from the first signal generation circuit exceeds a first prescribed level and an internal supply potential for an internal circuit outputted from internal supply potential generation means exceeds a second prescribed level.

23 Claims, 11 Drawing Sheets

(a) extVcc
(b) N1
(c) N4
(d) /POR
(e) POR (a) extVcc
(b) POR
(c) intVcc $t_1$ $t_7$ $t_8$ (a) extVcc
(b) POR
(c) intVcc $t_1$ $t_9$ $t_{10}$

POWER-ON RESET SIGNAL GENERATOR AND OPERATING METHOD THEREOF

CROSS-REFERENCE TO RELATED APPLICATION

This application is related to a copending application Ser. No. 732,194 filed Jul. 19, 1991 assigned with the present invention.

BACKGROUND OF THE INVENTION

1. Field of the Invention

The present invention relates to a power-on reset signal generator, and more particularly, it relates to a power-on reset signal generator for a semiconductor integrated circuit which comprises an internal supply potential generation circuit for supplying an internal power supply potential (hereinafter referred to as an internal supply potential) to an internal circuit in its chip.

2. DESCRIPTION OF THE BACKGROUND ART

FIG. 15 shows a conventional power-on reset signal generator. FIG. 16 is a timing chart showing actuating signals for respective parts provided in the power-on reset signal generator shown in FIG. 15.

Referring to FIG. 15, an external supply potential node 1 is supplied with an external power supply potential (hereinafter referred to as an external supply potential). A capacitor 2 is connected between the external supply potential node 1 and a first node 3. A first inverter 4 is driven by the external supply potential. The first inverter 4 has an input end which is connected to the first node 3, and an output end which is connected to a second node 5. The first inverter 4 outputs a high level potential (approximately the external supply potential) to the second node 5 when the potential of the first node 3 is at a low level (approximately the ground potential), while outputting a low level potential to the second node 5 when the potential of the first node 3 is at a high level.

The second node 5 is connected with a /POR output node 6, which outputs an inverted power-on reset signal/POR. A second inverter 7, which is driven by the external supply potential, has an input end which is connected to the second node 5 and an output end which is connected to a third node 8. The second inverter 7 outputs a high level potential (approximately the external supply potential) to the third node 8 when the potential of the second node 5 is at a low level (approximately the ground level), and outputs a low level potential to the third node 8 when the potential of the second node 5 is at a high level.

The third node 8 is connected with a POR output node 9 for outputting a power-on reset signal POR. A timer 10 includes a general delay circuit which is formed by capacitors and resistors. This timer 10 has an input end which is connected to the third node 8 and an output end which is connected to a fourth node 11. When a prescribed time elapses after a signal at the third node 8 rises from a low level to a high level, the timer 10 outputs a high level potential to the fourth node 11.

An n-channel MOS transistor 12 has a drain which is connected to the first node 3, a gate which is connected to the fourth node 11 and a source which is connected to a ground potential node 13. This transistor 12 enters a conductive state (ON) when the potential of its gate electrode goes high, to electrically connect the first node 3 with the ground potential node 13.

An operation of the aforementioned conventional power-on reset signal generator is now described with reference to the timing chart shown in FIG. 16.

First, an external supply potential extVcc which is supplied to the external supply potential node 1 starts to rise from a low level (approximately the ground potential) to a high level (approximately the external supply potential) at a time $t_1$, as shown at (a) in FIG. 16. In response to the rise of the external supply potential extVcc, a potential N1 of the first node 3 rises through the capacitor 2 to go high at a time $t_2$, as shown at (b) in FIG. 16.

The first inverter 4 receiving the potential N1 of the first node 3 outputs a signal based on the external supply potential extVcc to the second node 5 which is connected to the/POR output node 6 until the potential of the first node 3 exceeds a threshold value of the first inverter 4. When the potential of the first node 3 exceeds the threshold value of the first inverter 4, the first inverter 4 brings the second node 5 into the ground potential level. This state is illustrated between the times $t_1$ and $t_2$ at (d) in FIG. 16.

The second inverter 7, which receives the inverted power-on reset signal/POR shown at (d) in FIG. 16, is driven upon rise of the external supply potential extVcc since the inverted power-on reset signal/POR is at a low level. Thus, the second inverter 7 outputs the power-on reset signal POR, which rises on the basis of the external supply potential extVcc to go high at a time $t_3$ to the third node 8, which is connected to the POR output node 9, as shown at (e) in FIG. 16.

When a constant time $\Delta t$ elapses from the time $t_3$, a potential N4 of the fourth node 11 is brought into a high level from a low level by the timer 10 at a time $t_4$, as shown at (c) in FIG. 16. The constant time $\Delta t$ is determined by the timer 10 which receives the power-on reset signal POR.

Consequently, the n-channel MOS transistor 12 having the gate connected to the fourth node 11 is turned on. Thus, the first node 3 is electrically connected with the ground potential node 13, so that its potential N1 goes low at a time $t_5$, as shown at (b) in FIG. 16.

Thus, the inverted power-on reset signal/POR which rises from the low level to a high level at a time $t_6$ is outputted to the second node 5 which is connected to the/POR output node 6 by the first inverter 4 receiving the potential N1 of the first node 3, as shown at (d) in FIG. 16. Consequently, the power-On reset signal POR at the third node 8, which is connected to the POR output node 9, falls from the high level to a low level at a time $t_7$ by the second inverter 7 receiving the inverted power-on reset signal/POR, as shown at (e) in FIG. 16.

Thereafter the power-on reset signal POR remains at the low level until the potential of the external supply potential node 1 is brought into a low level.

The power-on reset signal POR outputted from such a power-on reset signal generator is applied to a semiconductor integrated circuit in the following manner:

FIG. 17 shows a flip-flop circuit which is formed by NOR gates 14 and 15. The NOR gate 14 has an input terminal which is connected to an input node 16, another input terminal which is connected to a POR input node 18, and still another input terminal which is connected to the output terminal of the NOR gate 15. The NOR gate 15 has an input terminal which is connected to an input node 17, and another input terminal which is connected to the output terminal of the NOR gate 14. The output terminal of the NOR gate 14 is connected also to an output node 19.

When all input signals received in the input nodes 16 and 17 and the POR input node 18 are at low levels, a potential of the output node 19 enters an indefinite state of a low or high level. When an input signal received in the POR input node 18 is at a high level, the potential of the output node 19 goes low regardless of input signals received in the input nodes 16 and 17.

In the flip-flop circuit shown in FIG. 17, the potential of the output node 19 enters an indefinite state in application of the external supply potential. When the power-on reset signal POR which is outputted from the aforementioned power-on reset signal generator is supplied to the POR input node 18, the potential of the output node 19 is reset from the indefinite state to a low level.

Meanwhile, recent development in refinement and high integration of LSIs results in the following problems: The gate width of a MOS transistor is so reduced that an electric field across its source and drain is increased in strength. Particularly when the MOS transistor operates in such a saturation region that a source-to-drain voltage is higher than a source-to-gate voltage, most of the source-to-drain voltage is applied to a depletion layer which is formed in the vicinity of the drain. Thus, the depletion layer forms a high electric field, which accelerates carriers. Consequently, the carriers collide with silicon atoms to generate electrons or holes, which attain energy for jumping over band gaps, to be incorporated in a gate oxide film. Thus, the threshold voltage of the transistor is fluctuated by a hot carrier effect.

With reduction in thickness of a gate oxide film, on the other hand, an electric field formed therein is increased in strength to break the oxide film.

Such problems of the hot carrier effect and breaking of the gate oxide film are particularly serious in consideration of reliability.

In order to suppress such problems in reliability, it is necessary to reduce the supply potential. However, it is considerably difficult to reduce the external supply potential in view of usage. To this end, there has been proposed a technique of providing an internal supply potential generation circuit in the interior of a chip for stepping down an external supply potential of 5.0 V, for example, to a lower internal supply potential of 3.3 V, for example, without reducing the external supply potential, and driving an internal circuit by the internal supply potential generation circuit.

FIGS. 18 and 19 are timing charts showing states of a power-on reset signal POR in the aforementioned power-on reset signal generator, which is applied to a semiconductor integrated circuit comprising an internal supply potential generation circuit in its chip.

FIG. 18 shows a steeply rising external supply potential extVcc. When the external supply potential extVcc starts to rise to a high level at a time $t_1$ as shown at (a) in FIG. 18, the power-on reset signal POR also rises with the rise of the external supply potential extVcc, and falls to a low level at a time $t_7$, as shown at (b) in FIG. 18.

Since the internal supply potential generation circuit has a large load capacitance, an internal supply potential intVcc rises not so steeply as the external supply potential extVcc but reaches a prescribed level at a time $t_8$ which is later than the time $t_7$ when the power-on reset signal POR falls to the low level, as shown at (c) in FIG. 18.

When the conventional power-on reset signal generator is applied to a semiconductor integrated circuit having an internal supply generation circuit in its chip as described above, the power-on reset signal may fall to a low level before the internal supply potential reaches a prescribed level if a steeply rising external supply potential extVcc is received. In this case, it is impossible to reliably reset a node, such as the output node 19 of the flip-flop circuit shown in FIG. 17, which is in an indefinite state when the external supply potential is applied in the internal circuit driven by the internal supply potential.

It may be possible to sufficiently increase the time $\Delta T$ between the rise time of the power-on reset signal POR received in the timer 10 and the output time of the high-level potential to the fourth node 11, so that the power-on reset signal POR will not fall to a low level before the internal supply potential reaches the prescribed level however the external supply potential rises. The time $\Delta t$ is determined by the timer 10 shown in FIG. 15.

When the external supply potential extVcc loosely rises as shown in FIG. 19, however, this leads to the following problem: When the external supply potential extVcc starts to rise to a high level at a time $t_1$ as shown at (a) in FIG. 19, an internal supply potential intVcc also rises following the rise of the external supply potential extVcc, and reaches a prescribed level at a time $t_9$, as shown at (c) in FIG. 19.

The power-on reset signal POR also rises with the rise of the external supply potential extVcc, as shown at (b) in FIG. 19. Then, the power-on reset signal POR falls to a low level at a time $t_{10}$ after a lapse of an extremely long period from the time $t_9$ when the internal supply potential intVcc reaches the prescribed level.

When the external supply potential extVcc loosely rises, the internal supply potential intVcc rises following the external supply potential extVcc and hence it is not necessary to set the aforementioned time $\Delta t$ long. Namely, if the time $\Delta t$ is so sufficiently increased that the power-on reset signal will not fall to a low level before the internal supply potential intVcc reaches the prescribed level however the external supply potential extVcc rises, a reset time is unnecessarily increased in relation to a loosely rising external supply potential extVcc.

SUMMARY OF THE INVENTION

An object of the present invention is to enable reliable resetting of an internal circuit.

Another object of the present invention is to provide a power-on reset signal generator which can reliably in a short time reset an indefinite node of an internal circuit which is driven by an internal supply potential and an operating method thereof.

Still another object of the present invention is to provide a semiconductor integrated circuit including a power-on reset signal generator which can reliably reset in a short time an internal circuit driven by an internal supply potential.

A power-on reset signal generator according to the present invention includes a first signal generation circuit and a second signal generation circuit.

The first signal generation circuit receives an external supply potential, and generates a signal which changes, when a prescribed time elapses from starting of a change of the external supply potential from the ground level to a first level, from the ground level to a second level.

The second signal generation circuit receives an internal supply potential from an internal supply potential generation circuit and the signal from the first signal generation circuit, and generates a power-on reset signal. This second signal generation circuit activates the power-on reset signal in response to the change of the external supply potential from the ground level to the first level, and inactivates the power-on reset signal in response to reaching of the signal from the first signal generation circuit to a first prescribed level and reaching of the internal supply potential to a second prescribed level.

According to the inventive power-on reset signal generator, the power-on reset signal is activated with the change of the external supply potential, and finally inactivated when the signal from the first signal generation circuit reaches the first prescribed level and the internal supply potential reaches the second prescribed level after a lapse of a prescribed time. In an internal circuit which is driven by the internal supply potential, therefore, a node which is in an indefinite state in application of the internal supply potential is reliably reset by such a power-on reset signal in a short time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

(1) First Embodiment

Figure 1:
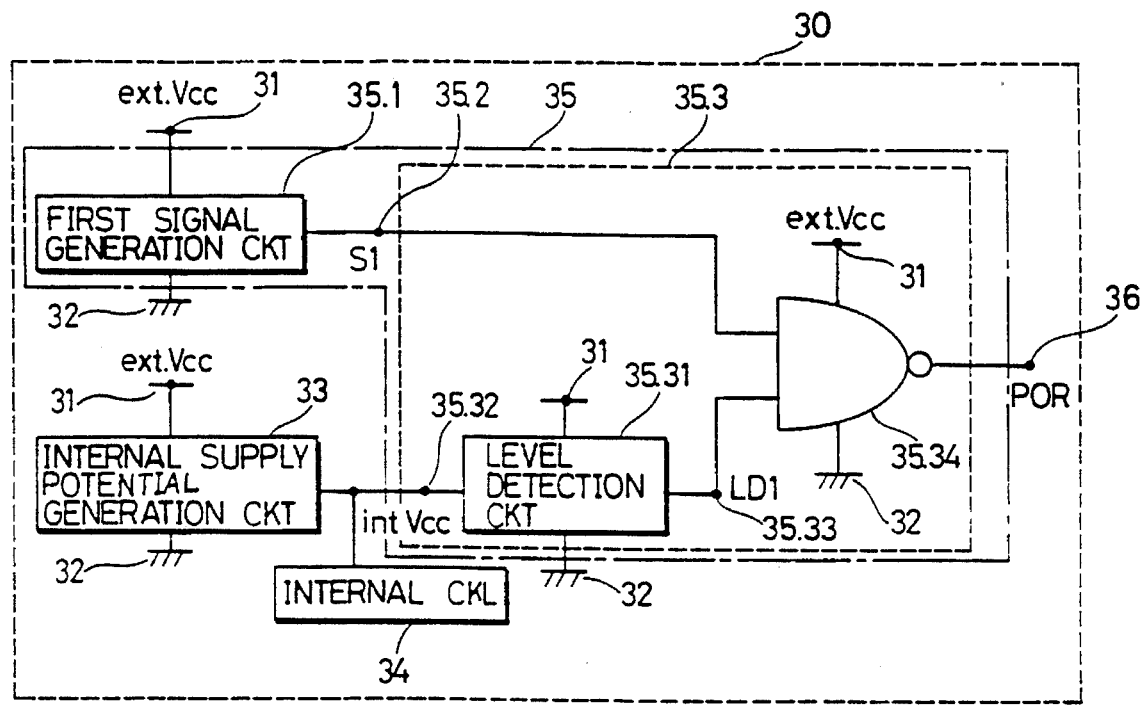
FIG. 1 is a block diagram showing a power-on reset signal generator according to a first embodiment of the present invention.
Figure 2:
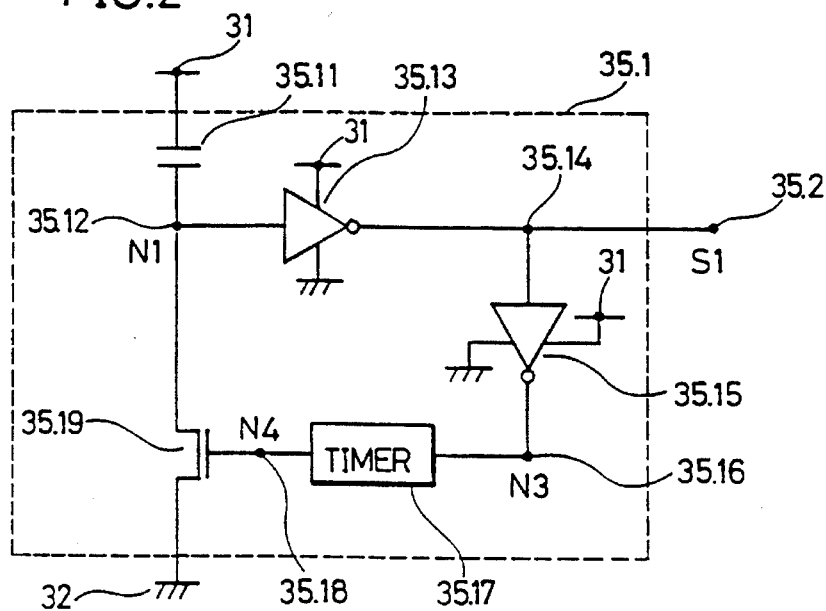
FIG. 2 is a circuit diagram showing an example of a first signal generation circuit which is included in the power-on reset signal generator shown in FIG. 1.
Figure 3:
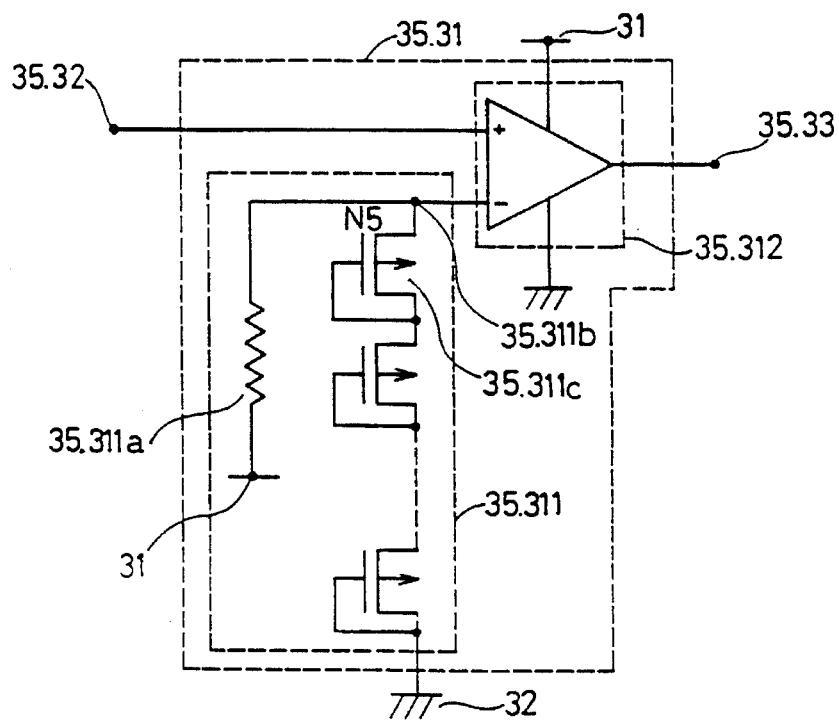
FIG. 3 is a circuit diagram showing an example of a level detection circuit which is included in the power-on reset signal generator shown in FIG. 1.

With reference to FIGS. 1 to 3, a power-on reset signal generator according to a first embodiment of the present invention is now described.

Referring to FIG. 1, a semiconductor integrated circuit 30 includes an internal supply potential generation circuit 33, an internal circuit 34 and a power-on reset signal generator 35. The power-on reset signal generator 35 includes a first signal generation circuit 35.1 and a second signal generation circuit 35.3.

An external supply potential is applied to an external supply potential node 31 from the exterior of the semiconductor integrated circuit 30. The potential of the external supply potential node 31 rises to a first level (5.0 V in the first embodiment) after application of the supply potential. This external supply potential is employed for circuits such as an output buffer requiring a sufficiently high potential and a reference potential generation circuit requiring a stable potential, although such circuits are not shown in the figures. The ground potential (0 V) is supplied to a ground potential node 32.

The internal supply potential generation circuit 33 receives the external supply potential supplied to the external supply potential node 31, and outputs an internal supply potential of a third level (3.3 V in the first embodiment) which is lower than the external supply potential (5.0 V). This internal supply potential is employed in the internal circuit 34, which includes a memory cell array in a semiconductor memory or the like.

The power-on reset signal generator 35 receives the external supply potential supplied to the external supply potential node 31 and the internal supply potential outputted from the internal supply potential generation circuit 33, and outputs a power-on reset signal to a POR output node 36.

The first signal generation circuit 35.1 outputs a signal, which rises to a second level when a prescribed time elapses after the external supply potential starts to rise from the ground level to the first level, to a signal output node 35.2. According to the first embodiment, the ground level, the first level, the second level and the prescribed time are 0 V, 5.0 V, 5.0 V and ΔT respectively.

FIG. 2 shows a specific structure of the first signal generation circuit 35.1. Referring to FIG. 2, a capacitor 35.11 is connected between the external supply potential node 31 and a first node 35.12. A first inverter 35.13, which is driven by the external supply potential, has an input end which is connected to the first node 35.12 and an output end which is connected to a second node 35.14. A second inverter 35.15, which is driven by the external supply potential, has an input end which is connected to the second node 35.14 and an output end which is connected to a third node 35.16.

A timer 35.17 includes a general delay circuit which is formed by capacitors and resistors. This timer 35.17 has an input end which is connected to the third node 35.16 and an output end which-is connected to a fourth node 35.18. The timer 35.17 outputs a high level potential to the fourth node 35.18 when a constant time elapses after a signal at the third node 35.16 rises from the ground level to a high level (approximately 5.0 V). A discharge transistor 35.19 includes an n-channel MOS transistor having a drain which is connected to the first node 35.12, a source which is connected to the ground potential node 32 and a gate which is connected to the fourth node 35.18.

Referring again to FIG. 1, the second signal generation circuit 35.3 receives the external supply potential, the signal outputted from the first signal generation circuit 35.1 and the internal supply potential outputted from the internal supply potential generation circuit 33, to output the power-on reset signal to the POR output node 36. The second signal generation circuit 35.3 includes a level detection circuit 35.31 and a logic circuit 35.34.

The level detection circuit 35.31 has an input end which is connected to an internal potential node 35.32 and an output end which is connected to a detection signal output node 35.33. This level detection circuit 35.31 outputs a level detection signal which rises to a high level (approximately 5.0 V) when the internal supply potential reaches a second prescribed level being lower than the third level (3.3 V).

The logic circuit 35.34 includes a two-input NAND gate having a first input terminal which is connected to the signal output node 35.2 and a second input terminal which is connected to the detection signal output node 35.33. The output end of this two-input NAND gate is connected to the POR output node 36. The two-input NAND gate substantially outputs the external supply potential when at least one of the potentials of the first and second input terminals is at a low level, while the same outputs the ground potential when both potentials of the first and second input terminals are at high levels.

FIG. 3 shows a specific structure of the level detection circuit 35.31. Referring to FIG. 3, the level detection circuit 35.31 includes a reference potential generation circuit 35.311 and a differential amplifier circuit 35.312.

The reference potential generation circuit 35.311 receives the external supply potential, and outputs a constant reference potential which is slightly lower than the third level (3.3 V). This reference voltage generation circuit 35.311 includes a resistor 35.311a and a reference potential generation part. The resistor 35.311a is connected between the external supply potential node 31 and a fifth node 35.311b. The reference potential generation part includes a plurality of p-channel MOS transistors 35.311c which are connected in series between the fifth node 35.311b and the ground potential node 32. The gate and the drain of each p-channel MOS transistor 35.311c is connected with each other. The reference potential generation part outputs a potential which is obtained by multiplying the absolute value of the threshold voltage of a p-channel MOS transistor 35.311c by the number of these p-channel MOS transistors 35.311c to the fifth node 35.311b as a reference potential.

The differential amplifier circuit 35.312, which is driven by the external supply potential, has a positive-phase input end which is connected to the internal potential node 35.32 and a negative-phase input end which is connected to the fifth node 35.311b receiving the reference potential outputted from the reference potential generation circuit 35.311. The output end of the differential amplifier circuit 35.312 is connected to the detection signal output node 35.33. This differential amplifier circuit 35.312 outputs a potential which is obtained by multiplying the difference between the potentials of the positive- and negative-phase input ends by a differential gain to the detection signal output node 35.33.

In the reference potential generation circuit 35.311, the number of the p-channel MOS transistors 35.311c connected between the fifth node 35.311b and the ground potential node 32 is so determined that the fifth node 35.311b has the following potential: The potential of the fifth node 35.311b is so determined that, when the potential of the internal potential node 35.32 is 3.3 V, a potential obtained by multiplying the difference between the potential of 3.3 V and the reference potential supplied to the fifth node 35.311b is 5.0 V.

The operation of the power-on reset signal generator according to the first embodiment is now described with reference to timing charts shown in FIGS. 4 to 7.

Figure 4:
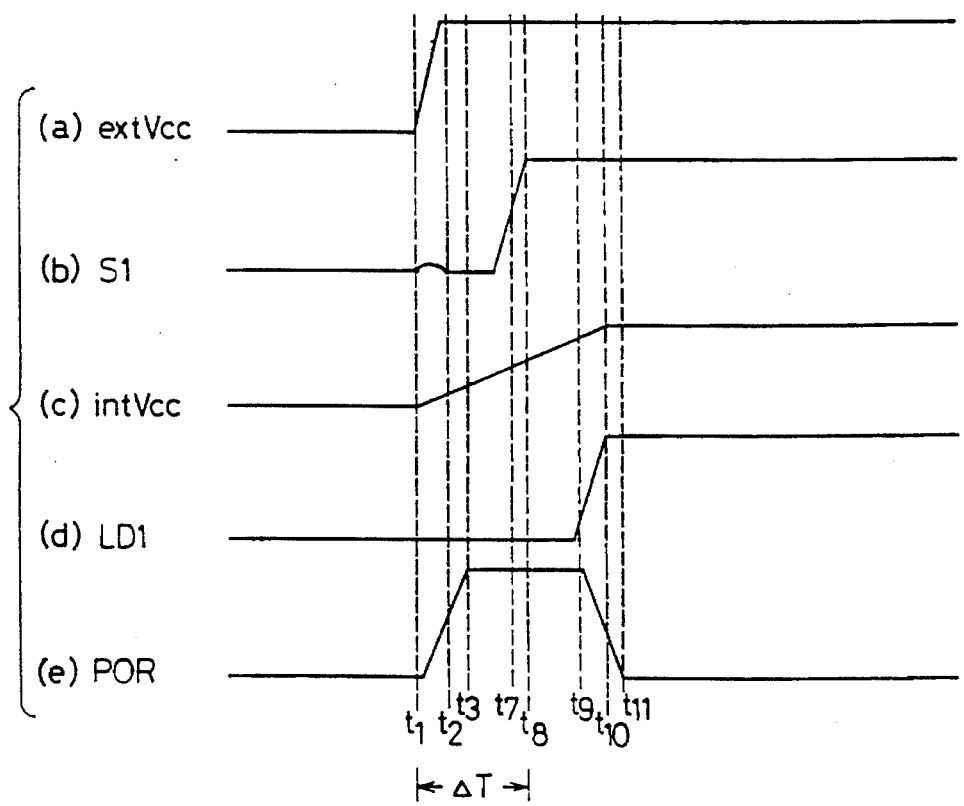
FIG. 4 is a timing chart showing operating timing of the power-on reset signal generator shown in FIG. 1 in relation to a steeply rising external supply potential.

FIG. 4 shows operation timing of the power-on reset signal generator in relation to a steeply rising external supply potential extVcc.

First, the external supply potential extVcc supplied to the external supply potential node 31 starts to rise from the ground level (0 V) to the first level (5.0 V) at a time $t_1$, as shown at (a) in FIG. 4. Thus, the potential N1 of the first node 35.12 of the first signal generation circuit 35.1 shown in FIG. 2 rises from the ground potential in response to the rise of the external supply potential extVcc, to reach a high level (approximately 5.0 V) at a time $t_2$, as shown at (b) in FIG. 5.

The first inverter 35.13 receiving the potential N1 of the first node 35.12 is also driven when the external supply potential extVcc rises. Thus, a signal S1 which is outputted from the first inverter 35.13 to the second node 35.14 being connected to the signal output node 35.2 is brought into a low level which is slightly higher than the ground level before the time $t_2$, and reaches the ground level at the time $t_2$.

The logic circuit 35.34 which receives the signal S1 in its first input terminal is also driven when the external supply potential extVcc rises. Since at least the output signal S1 of the first signal generation circuit 35.1 is still at a low level (approximately the ground level), a power-on reset signal POR which is outputted from the logic circuit 35.34 to the POR output node 36 rises from the ground level (0 V) with the external supply potential extVcc, and reaches a high level (approximately 5.0 V) at a time $t_3$, as shown at (e) in FIG. 4.

Figure 6:
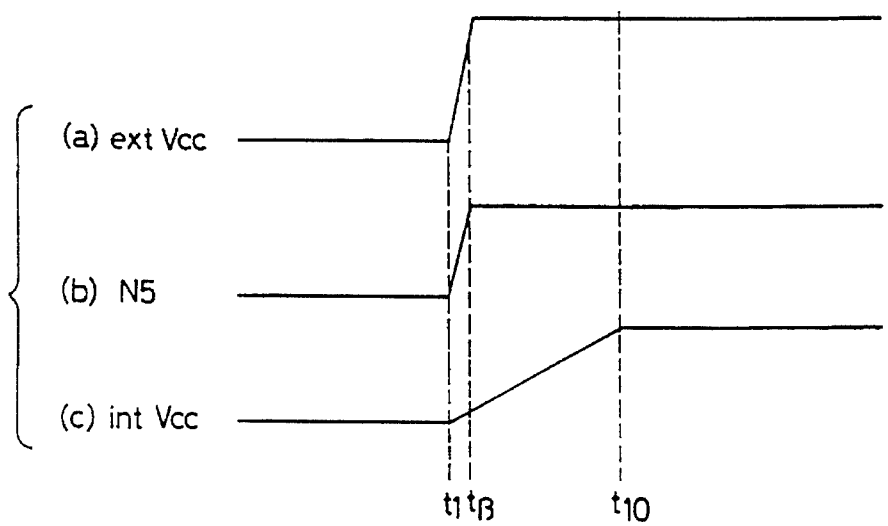
FIG. 6 is a timing chart showing operation timing of the level detection circuit shown in FIG. 3.

On the other hand, a potential N5 of the fifth node 35.311b of the reference potential generation circuit 35.311 provided in the level detection circuit 35.31 rises with the external supply potential extVcc, as shown at (b) in FIG. 6. When the potential N5 of the fifth node 35.311b reaches the reference potential obtained by multiplying the absolute value of the threshold voltage of one of the p-channel MOS transistors 35.311c connected between the fifth node 35.311b and the ground potential node 32 by the number thereof at a time $t_\beta$, these p-channel MOS transistors 35.311c are turned on. Thus, the potential N5 of the fifth node 35.311b will not exceed the reference potential.

The second inverter 35.15 (see FIG. 2) provided in the first signal generation circuit 35.1 receiving the signal S1 is also driven when the external supply potential extVcc rises. Thus, a potential N3 of the third node 35.16 goes high at a time $t_4$ by the second inverter 35.15, as shown at (c) in FIG. 5.

Figure 5:
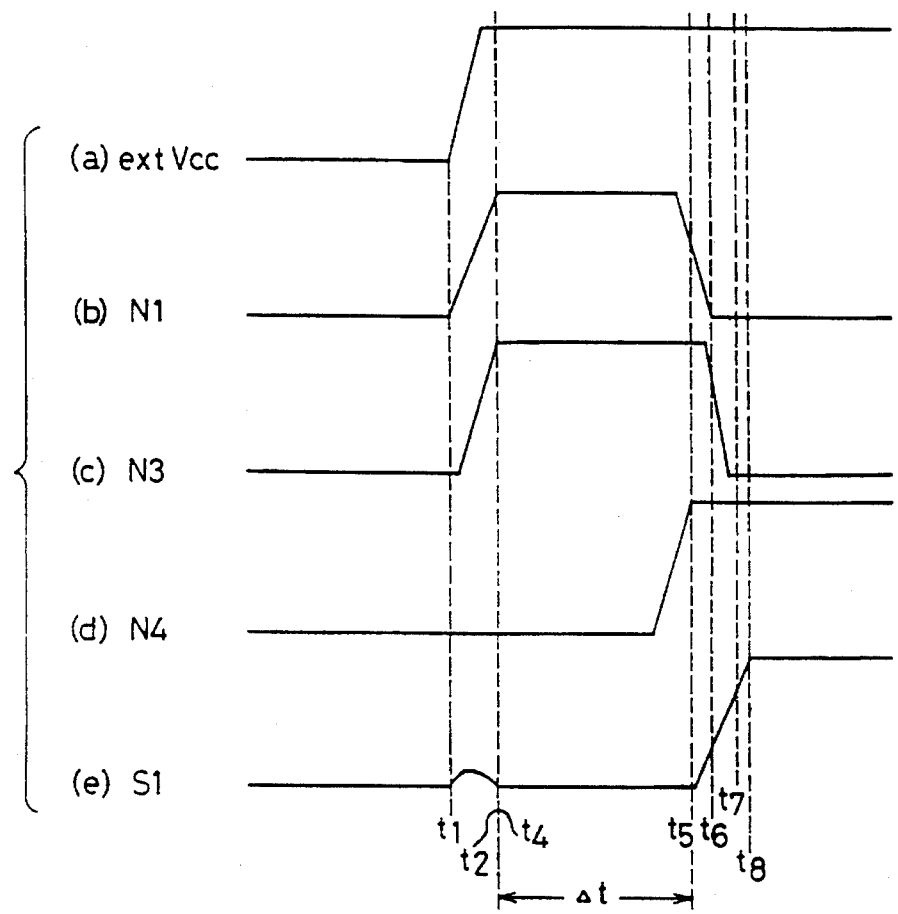
FIG. 5 is a timing chart showing operation timing of the first signal generation circuit shown in FIG. 2.

As shown at (d) in FIG. 5, a potential N4 of the fourth node 35.18 goes high at a time $t_5$ after a lapse of the time at from the time $t_4$ by the timer 35.17 receiving the potential N3 of the third node 35.16.

Thus, the n-channel MOS transistor 35.19 receiving the potential N4 of the fourth node 35.18 is turned on to electrically connect the first node 35.12 with the ground potential node 32. As the result, the potential N1 of the first node 35.12 reaches the ground level at a time $t_6$ as shown at (b) in FIG. 5.

Thus, the signal S1 outputted to the signal output node 35.2 by the first inverter 35.13 receiving the potential N1 of the first node 35.12 rises from the ground level and exceeds a high level of the first prescribed level which is lower than the second level (5.0 V) at a time $t_7$, as shown at (e) in FIG. 5 and at (b) in FIG. 4. Further, the signal S1 reaches the second level (5.0 V) at a time $t_8$ after a lapse of the prescribed time $\Delta T$ from the time $t_1$ when the external supply potential starts to rise from the ground level (0 V) to the first level (5.0 V).

On the other hand, the internal supply potential intVcc which is outputted from the internal supply potential generation circuit 33 starts to rise with the external supply potential extVcc and exceeds the reference potential outputted from the reference potential generation circuit 35.311 of the level detection circuit 35.31, as shown at (c) in FIG. 4. When the internal supply potential intVcc exceeds the second prescribed level which is lower than the third level (3.3 V) at a time $t_9$, the level detection circuit 35.31 outputs a level detection signal LD1 which reaches a high level (approximately 5.0 V) at a time $t_{10}$ to the detection signal output node 35.33, as shown at (d) in FIG. 4.

When both of the output signal S1 from the first signal generation circuit 35.1 and the level detection signal LD1 from the level detection circuit 35.31 supplied to the first and second input terminals of the logic circuit 35.34 respectively go high as shown at (b) and (d) in FIG. 4, the power-on reset signal POR outputted from the logic circuit 35.34 to the POR output node 36 falls to the ground level at a time $t_{11}$, as shown at (e) in FIG. 4.

The above description has been made in relation to a steeply rising external supply potential extVcc.

Figure 7:
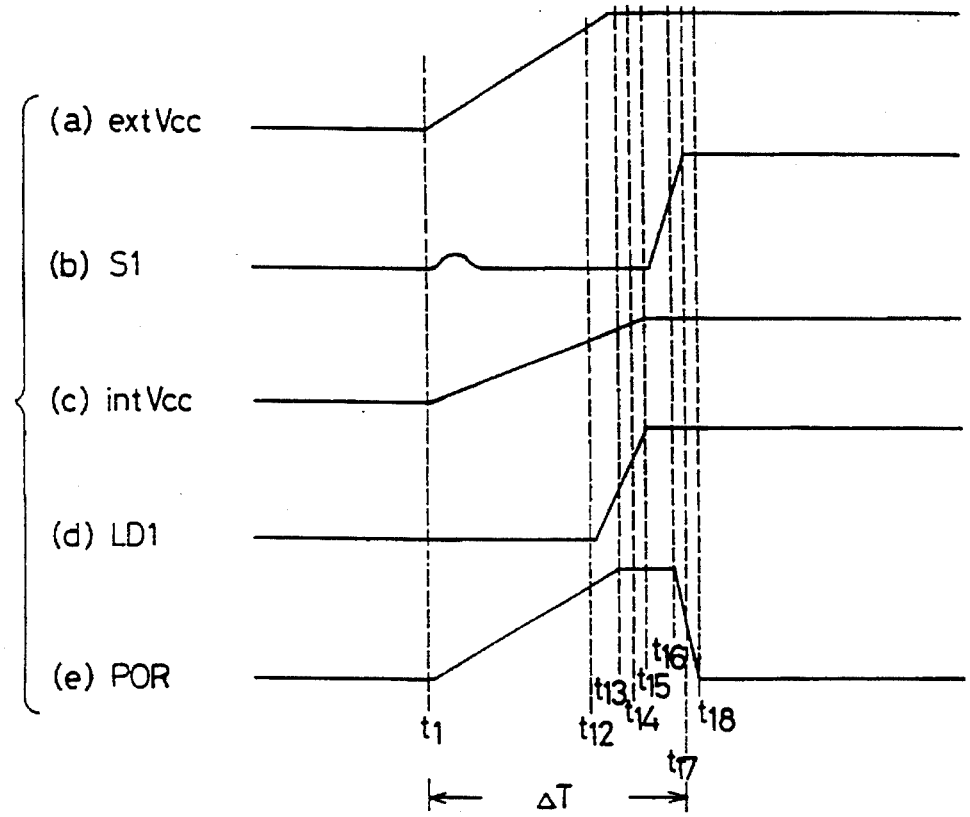
FIG. 7 is a timing chart showing operation timing of the power-on reset signal generator shown in FIG. 1 in relation to a loosely rising external supply potential.

The operation is further described in relation to a loosely rising external supply potential extVcc with reference to FIG. 7.

As shown at (a) in FIG. 7, the external supply potential extVcc which is supplied to the external supply potential node 31 starts to rise from the ground level (0 V) to the first level (5.0 V) at a time $t_1$. Thus, the signal S1 outputted by the first signal generation circuit 35.1 goes to a low level which is slightly higher than the ground potential before a time $t_{12}$, and reaches the ground level at the time $t_{12}$, similarly to the aforementioned case in relation to the steeply rising external supply potential extVcc.

Therefore, the power-on reset signal POR rises from the ground level (0 V) with the external supply potential extVcc, and reaches a high level (approximately 5.0 V) at a time $t_{13}$, as shown at (e) in FIG. 7.

As shown at (c) in FIG. 7, the internal supply potential intVcc outputted by the internal supply potential generation circuit 33 rises following the rise of the external supply potential extVcc to exceed the reference potential outputted from the reference potential generation circuit 35.311 of the level detection circuit 35.31, and exceeds the second prescribed level which is lower than the third level (3.3 V) at a time $t_{14}$. As shown at (d) in FIG. 7, the level detection circuit 35.31 receiving the internal supply potential intVcc outputs the level detection signal LD1 which reaches a high level (approximately 5.0 V) at a time $t_{15}$ to the detection signal output node 35.33.

When the potential N1 of the first node 35.12 reaches the ground level by conduction of the n-channel MOS transistor 35.19, on the other hand, the signal S1 outputted from the first signal generation circuit 35.1 rises from the ground level, and exceeds the high level of the first prescribed level which is lower than the second level (5.0 V) at a time $t_{16}$. Further, the signal S1 rises to the second level (5.0 V) at a time $t_{17}$ when the prescribed time $\Delta T$ elapses after the time $t_1$ when the external supply potential extVcc starts to rise from the ground level (0 V) to the first level (5.0 V).

When both of the output signal S1 of the first signal generation circuit 35.1 and the level detection signal LD1 of the level detection circuit 35.31 supplied to the first and second input terminals of the logic circuit 35.34 respectively exceed the first prescribed level as shown at (b) and (d) in FIG. 7, the power-on reset signal POR which is outputted from the logic circuit 35.34 to the POR output node 36 falls to the ground level at a time $t_{18}$, as shown at (e) in FIG. 7.

In the power-on reset signal generator according to the first embodiment of the present invention, as hereinabove described, the power-on reset signal POR rises with the external supply potential extVcc. The output signal S1 from the first signal generation circuit 35.1 rises when the prescribed time $\Delta T$ elapses after the external supply potential extVcc starts to rise from the ground level (0 V) to the first level (5.0 V). The power-on reset signal POR falls when the signal S1 reaches the first prescribed level of a high level which is lower than the second level (5.0 V) and the internal supply potential intVcc reaches the second prescribed level which is lower than the third level (3.3 V).

Figure 17:
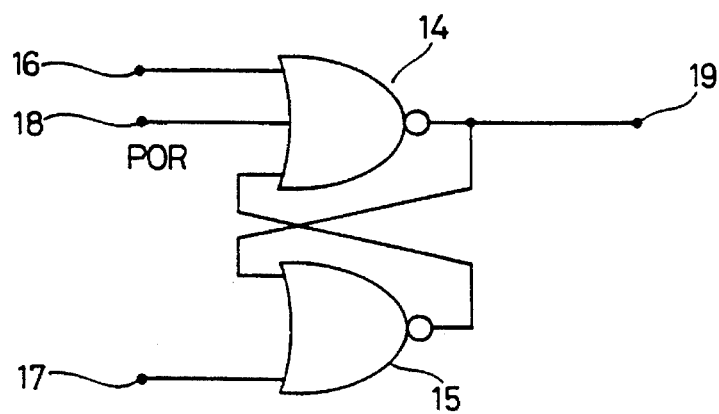
FIG. 17 shows a flip-flop circuit for illustrating an example of a node which is in an indefinite state.
Figure 18:
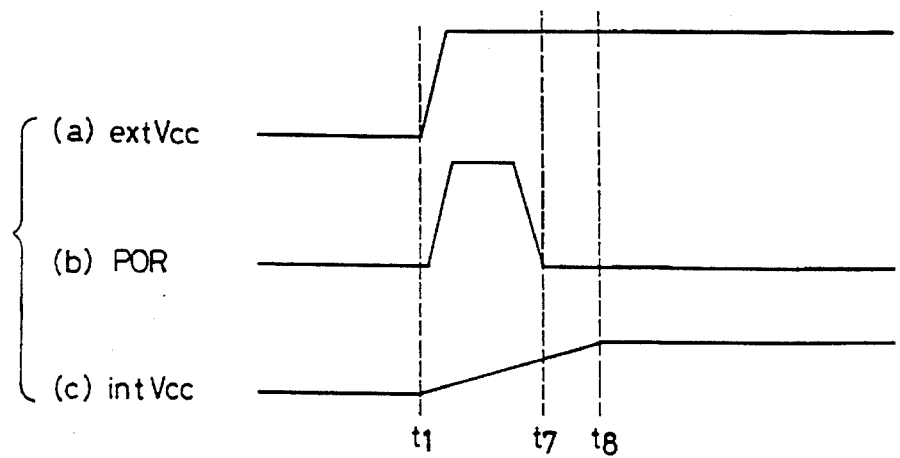
FIG. 18 is a timing chart showing operation timing of a conventional power-on reset signal generator which is applied to a semiconductor integrated circuit having an internal supply potential generation circuit in relation to a steeply rising external supply potential.
Figure 19:
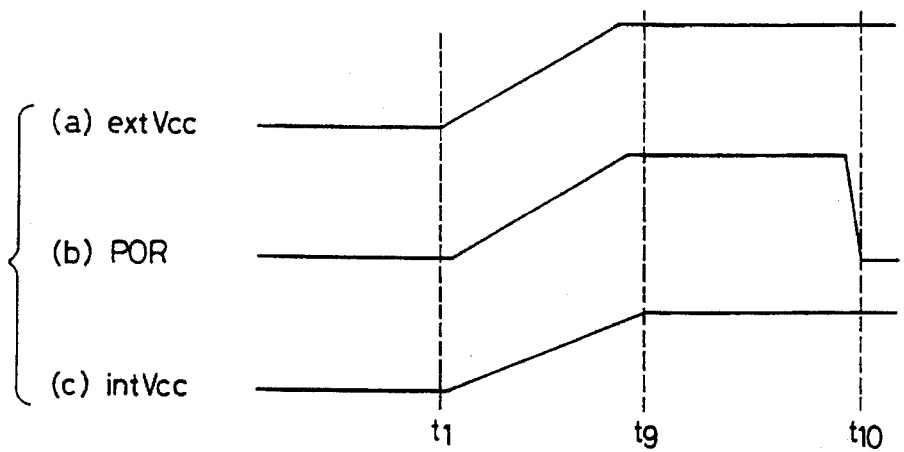
FIG. 19 is a timing chart showing operation timing of the conventional power-on reset signal generator which is applied to the semiconductor integrated circuit having an internal supply potential generation circuit in relation to a loosely rising external supply potential.

In the internal circuit which is driven by the internal supply potential, therefore, it is possible to reliably reset the output node 19 which is in an indefinite state in application of the external supply potential extVcc by inputting the aforementioned power-on reset signal POR in the POR input node 18 of the flip-flop circuit shown in FIG. 17, for example.

The reset time between the time when the internal supply potential intVcc reaches the second prescribed level and that when the power-on reset signal POR falls is determined by one of the signal S1 outputted from the first signal generation circuit 35.12 and the level detection signal LD1 outputted from the level detection circuit 35.31 receiving the internal supply potential intVcc, which rises to a high level later. Whichever signal determines the reset time, this reset time is not excessively increased also when a loosely rising external supply potential extVcc is received.

(2) Second Embodiment

A power-on reset signal generator according to a second embodiment of the present invention is now described with reference to FIGS. 8 and 9.

Figure 8:
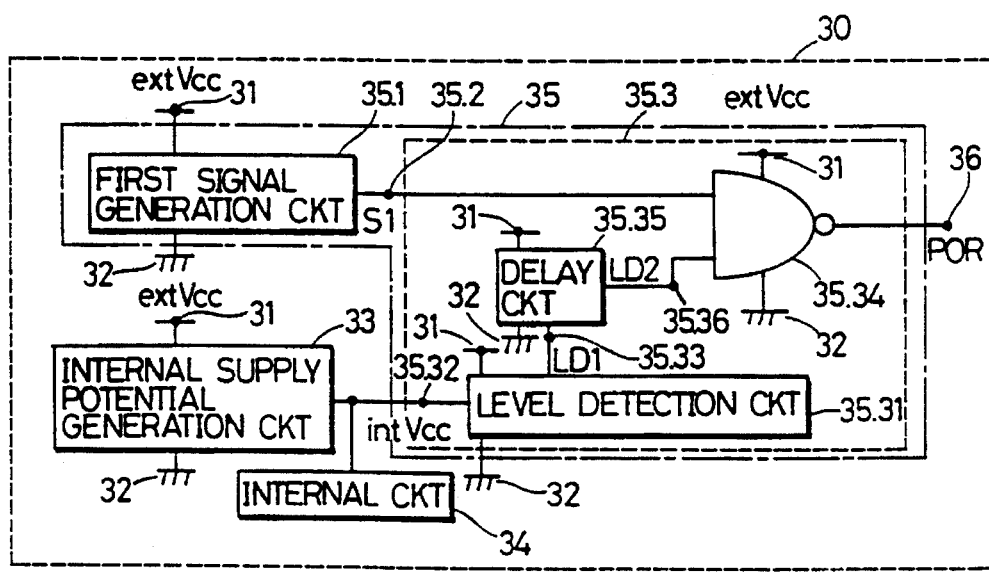
FIG. 8 is a block diagram showing the structure of a power-on reset signal generator according to a second embodiment of the present invention.

The power-on reset signal generator according to the second embodiment is different from that of the first embodiment in a point that a second signal generation circuit 35.3 shown in FIG. 8 further includes a delay circuit 35.35 which is connected between a level detection circuit 35.31 and a second input terminal of a logic circuit 35.34.

The delay circuit 35.35 receives a level detection signal LD1 which is outputted from the level detection circuit 35.31 to a detection signal output node 35.33, and outputs a level detection delay signal LD2 which is obtained by delaying the level detection signal LD1 by a delay time $\Delta T_d$ to a delay signal output node 35.36.

Figure 9:
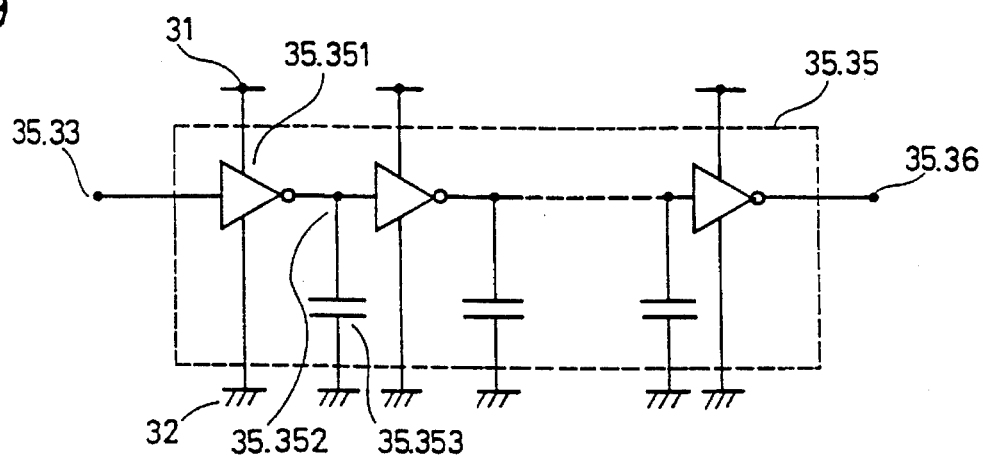
FIG. 9 is a circuit diagram showing an example of a delay circuit which is included in the power-on reset signal generator shown in FIG. 8.

As shown in FIG. 9, the delay circuit 35.35 includes a plurality of inverters 35.351 and a plurality of capacitors 35.353. The plurality of inverters 35.351 are connected in series between the detection signal output node 35.33 and the delay signal output node 35.36. The first electrode of each capacitor 35.353 is connected to a node 35.352 between the inverters 35.351, while the second electrode of each capacitor 35.353 is grounded. The number of the inverters 35.351 are so determined that the delay time is $\Delta T_d$. The delay time is increased in proportion to the number of the inverters 35.351.

The operation of the power-on reset signal generator according to the second embodiment is now described with reference to timing charts shown in FIGS. 10 and 11.

Figure 10:
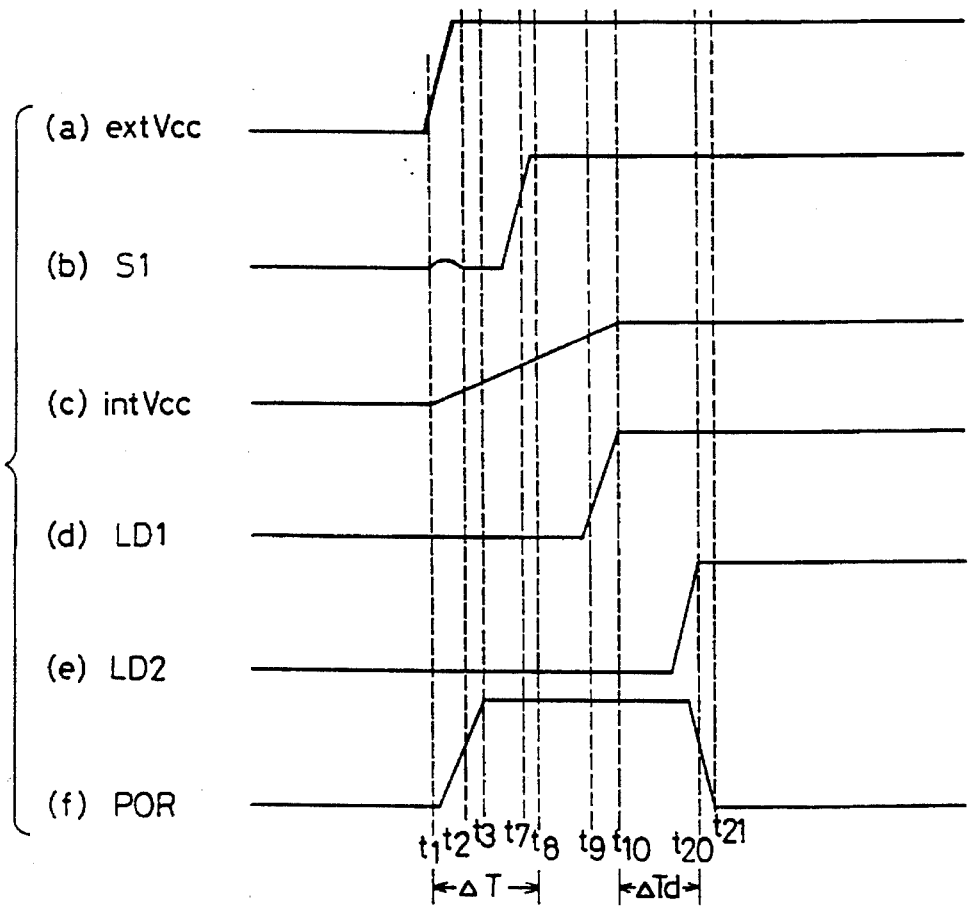
FIG. 10 is a timing chart showing operation timing of the power-on reset signal generator shown in FIG. 8 in relation to a steeply rising external supply potential.

FIG. 10 shows operation timing of the power-on reset signal generator according to the second embodiment in relation to a steeply rising external supply potential extVcc.

As shown at (a) in FIG. 10, the external supply potential extVcc starts to rise from the ground level at a time $t_1$. Further, a power-on reset signal POR rises to a high level (approximately 5.0 V) at a time $t_3$, as shown at (f) in FIG. 10. As shown at (b) in FIG. 10, a signal S1 outputted by a first signal generation circuit 35.1 rises from the ground level, exceeds a first prescribed level at a time $t_7$, and reaches a second level (5.0 V) at a time $t_8$.

As shown at (c) in FIG. 10, an internal supply potential intVcc outputted from an internal supply potential generation circuit 33 exceeds a second prescribed level at a time $t_9$. As shown at (d) in FIG. 10, the level detection signal LD1 outputted by the level detection circuit 35.31 reaches a high level of a first level (5.0) at a time $t_{10}$. The above operation is similar to that of the first embodiment.

After the level detection signal LD1 rises to the high level substantially equal to the first level (5.0 V) at the time $t_{10}$ as shown at (d) in FIG. 10, the level detection delay signal LD2 outputted by the delay circuit 35.35 to the delay signal output node 35.36 rises from the ground level (0 V) to a high level substantially equal to the first level (5.0 V) at a time $t_{20}$ when the delay time $\Delta T_d$ elapses from the time $t_{10}$.

When both of the output signal S1 from the first signal generation circuit 35.1 and the level detection delay signal LD2 from the delay circuit 35.35 supplied to first and second input terminals of the logic circuit 35.34 go high, the power-on reset signal POR outputted by the logic circuit 35.34 to the POR output node 36 falls to the ground level at a time $t_{21}$, as shown at (f) in FIG. 10.

Figure 11:
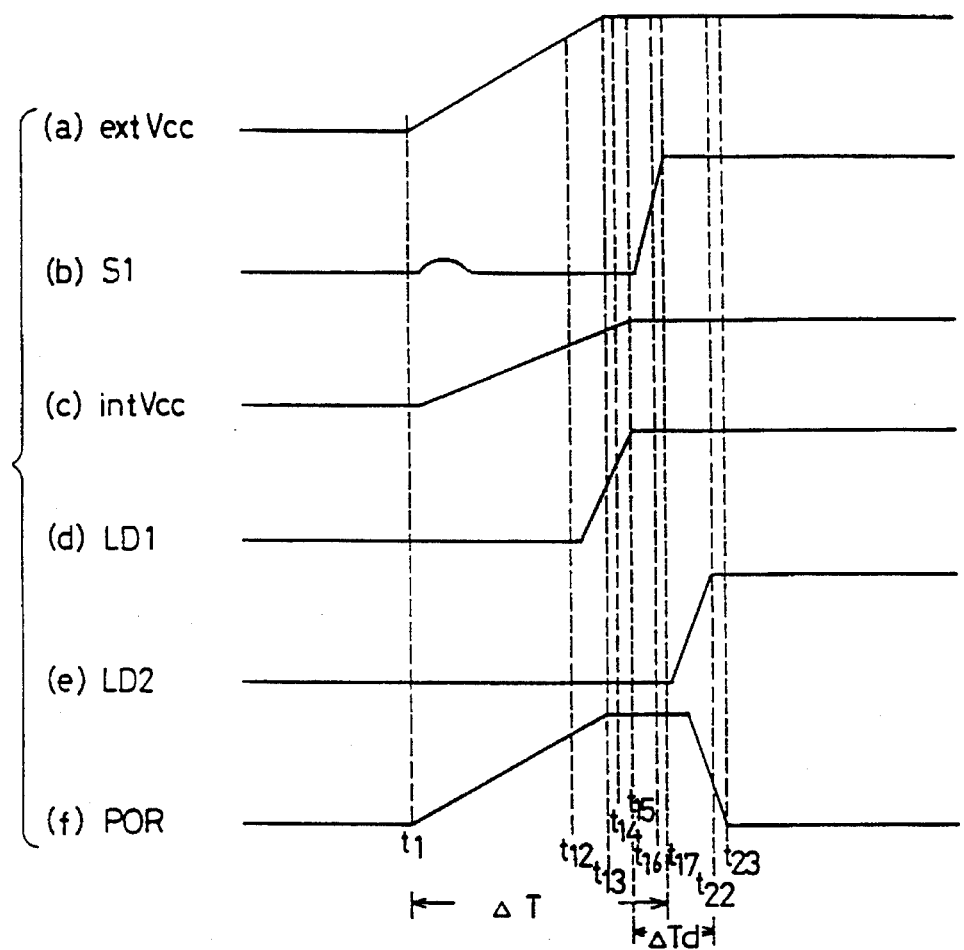
FIG. 11 is a timing chart showing operation timing of the power-on reset signal generator shown in FIG. 8 in relation to a loosely rising external supply potential.

FIG. 11 shows operation timing of the power-on reset signal generator according to the second embodiment in relation to a loosely rising external supply potential extVcc.

As shown at (a) in FIG. 11, the external supply potential extVcc starts to rise from the ground level at a time $t_1$. As shown at (f) in FIG. 11, the power-on reset signal POR rises to a high level (approximately 5.0 V) at a time $t_{13}$. As shown at (c) in FIG. 11, the internal supply potential intVcc outputted by the internal supply potential generation circuit 33 rises following the rise of the external supply potential extVcc, and exceeds the second prescribed level at a time $t_{14}$.

As shown at (d) in FIG. 11, the level detection signal LD1 outputted from the level detection circuit 35.31 reaches a high level which is substantially at the first level (5.0 V) at a time $t_{15}$. As shown at (b) in FIG. 11, the signal S1 outputted from the first signal generation circuit starts to rise from the ground level, exceeds the first prescribed level at a time $t_{16}$ and reaches the second level (5.0 V) at a time $t_{17}$. The above operation is similar to that of the first embodiment.

After the signal S1 rises from the ground level to the second level (5.0 V) at the time $t_{17}$ as shown at (b) in FIG. 11, the level detection delay signal LD2 which is outputted from the delay circuit 35.35 receiving the level detection signal LD1 to the delay signal output node 35.36 rises from the ground level (0 V) to a high level which is substantially identical to the first level (5.0 V) at a time $t_{22}$ delayed by the delay time $\Delta T_d$ from the time $t_{15}$, as shown at (e) in FIG. 11.

When both of the output signal S1 from the first signal generation circuit 35.1 and the level detection delay signal LD2 from the delay circuit 35.35 supplied to the first and second input terminals of the logic circuit 35.34 respectively exceed the first prescribed level as shown at (b) and (e) in FIG. 11, the power-on reset signal POR outputted by the logic circuit 35.34 to the POR output node 36 falls to the ground level at a time $t_{23}$, as shown at (f) in FIG. 11.

According to the power-on reset signal generator of the second embodiment, a node which is in an indefinite state in application of the external supply potential extVcc is reliably reset by the power-on reset signal POR in an internal circuit which is driven by the internal supply potential intVcc, similarly to the first embodiment. Further, the time between the rise and fall times of the power-on reset signal POR is slightly increased as compared with the first embodiment, due to provision of the delay circuit 35.35. Thus, it is possible to further reliably reset the node which is in an indefinite state in application of the external supply potential extVcc.

The reset time between the time when the internal supply potential intVcc reaches the second prescribed level and that when the power-on reset signal POR falls is determined by one of the signal S1 outputted by the first signal generation circuit 35.1 and the level detection delay signal LD2 outputted by the delay circuit 35.35 receiving the level detection signal LD1, which rises to a high level later. When the reset time is determined by the level detection delay signal LD2, the reset time is slightly longer than that in the first embodiment. Whichever signal determines the reset time, however, this reset time is not excessively increased also when a loosely rising external supply potential extVcc is received since the delay time $\Delta T_d$ determined by the delay circuit 35.35 is set at a short period.

(3) Third Embodiment

Figure 12:
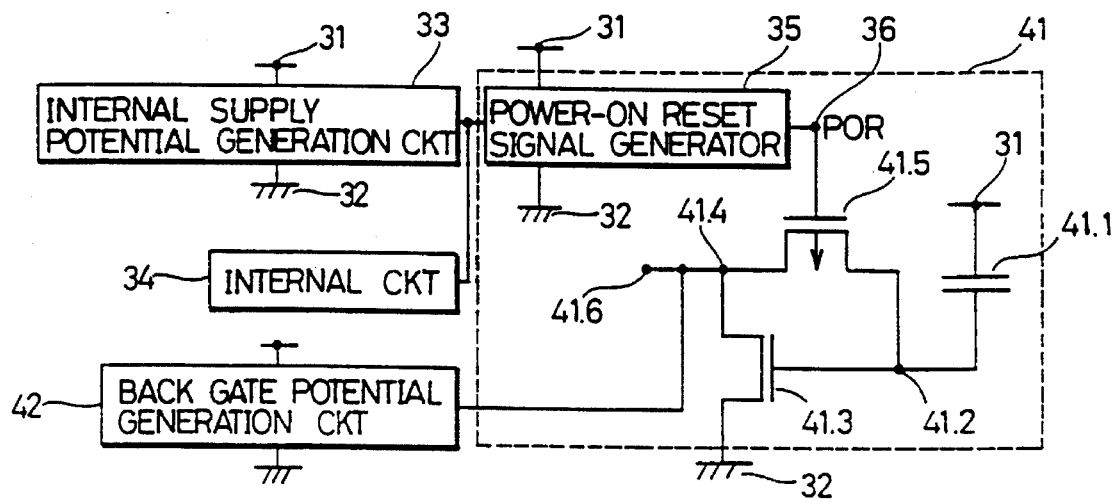
FIG. 12 is a block diagram showing a substrate ground system to which the inventive power-on reset signal generator is applied.

FIG. 12 shows a substrate ground system 41 to which a power-on reset signal generator 35 according to the first or second embodiment is applied. This substrate ground system 41 is adapted to ground an LSI substrate in application of an external supply potential.

Referring to FIG. 12, a capacitor 41.1 is connected between an external supply potential node 31 and a sixth node 41.2. A discharge transistor 41.3 includes an n-channel MOS transistor having a drain which is connected to a seventh node 41.4, a source which is connected to a ground potential node 32, and a gate which is connected to the sixth node 41.2.

A transfer transistor 41.5 includes a p-channel MOS transistor having a source which is connected to the sixth node 41.2, a drain which is connected to the seventh node 41.4, and a gate which is connected to a POR output node 36. A substrate connection end 41.6, which is connected to the LSI substrate, is connected to the seventh node 41.4.

A back gate potential generation circuit 42 extracts charges from a p-type semiconductor LSI substrate to bring the potential of the substrate to a back gate potential level of −3 V, for example, and applies a reverse-bias potential across the p-type semiconductor substrate and a source/drain region of a transistor formed by an $n^+$-type diffusion region. When a node which is connected to the $n^+$-type diffusion region holds data corresponding to a high level potential in the semiconductor integrated circuit, therefore, the data corresponding to the high-level potential is prevented from destruction caused by injection of electrons in the source/drain region of the transistor formed by the $n^+$-type diffusion region from the p-type semiconductor substrate.

The operation of the substrate ground system 41 according to the third embodiment is now described.

When the external supply potential supplied to the external supply potential node 31 rises, the potential of the sixth node 41.2 which is connected to the gate of the discharge transistor 41.3 is increased through the capacitor 41.1. Thus, the discharge transistor 41.3 enters a conductive state (ON), to electrically connect the seventh node 41.4, which is connected to the substrate connection end 41.6, with the ground potential node 32. Consequently, the substrate connection end 41.6 reaches the ground level.

At this time, a power-on reset signal POR from the power-on reset signal generator 35 rises with the external supply potential, to bring the transfer transistor 41.5 into a non-conductive state (OFF). Thus, the sixth and seventh nodes 41.2 and 41.4 are electrically disconnected from each other. Further, charges are extracted from the substrate connection end 41.6 by the back gate potential generation circuit 42, whereby the potential of the substrate connection end 41.6 reaches a level which is slightly lower than the ground level.

When a signal S1 outputted by a first signal generation circuit 35.1 (see FIG. 1 or 8) provided in the power-on reset signal generator 35 exceeds a high level of a first prescribed level which is lower than a second level (5.0 V) and an internal supply potential outputted from an internal supply potential generation circuit 33 exceeds a second prescribed level which is lower than a third level (3.3 V), the power-on reset signal POR outputted by the power-on reset signal generator 35 to the POR output node 36 falls to a low level. Thus, the transfer transistor 41.5 enters a conductive state (ON), to electrically connect the sixth and seventh nodes 41.2 and 41.4 with each other.

Consequently, the sixth node 41.2 is electrically connected to the ground potential node 32 through the transfer transistor 41.5, the seventh node 41.4 and the discharge transistor 41.3. Thus, the potential of the sixth node 41.2 is lowered substantially to the ground level.

When the potential of the sixth node 41.2 substantially reaches the ground level, the discharge transistor 41.3 enters a non-conductive state (OFF), and the substrate connection end 41.6 is brought into the back gate potential of −3 V by the back gate potential generation circuit 42.

In the substrate ground system 41 according to the third embodiment, the power-on reset signal POR which is outputted from the power-on reset signal generator 35 according to the present invention in application of the external supply potential will not fall until the internal supply potential outputted from the internal supply potential generation circuit 33 (see FIG. 1 or 8) exceeds the second prescribed level. Thus, it is possible to bring the LSI substrate substantially to the ground level during this period.

Therefore, it is possible to prevent the potential of the LSI substrate from increase caused by junction capacitance between a diffusion layer forming the external supply potential node 31 and the LSI substrate in application of the external supply potential, while it is also possible to prevent the potential of the LSI substrate from increase caused by junction capacitance between an output node (well) of the internal supply potential generation circuit 33 and the LSI substrate.

Thus, it is possible to quickly bring the potential of the LSI substrate to the back gate potential level of −3 V not by reducing the potential of the LSI substrate increased from the ground potential by junction capacitance to the back gate potential level of −3 V but by reducing the potential of the LSI substrate substantially at the ground level to the back gate potential level of −3 V.

(4) Fourth Embodiment

Figure 13:
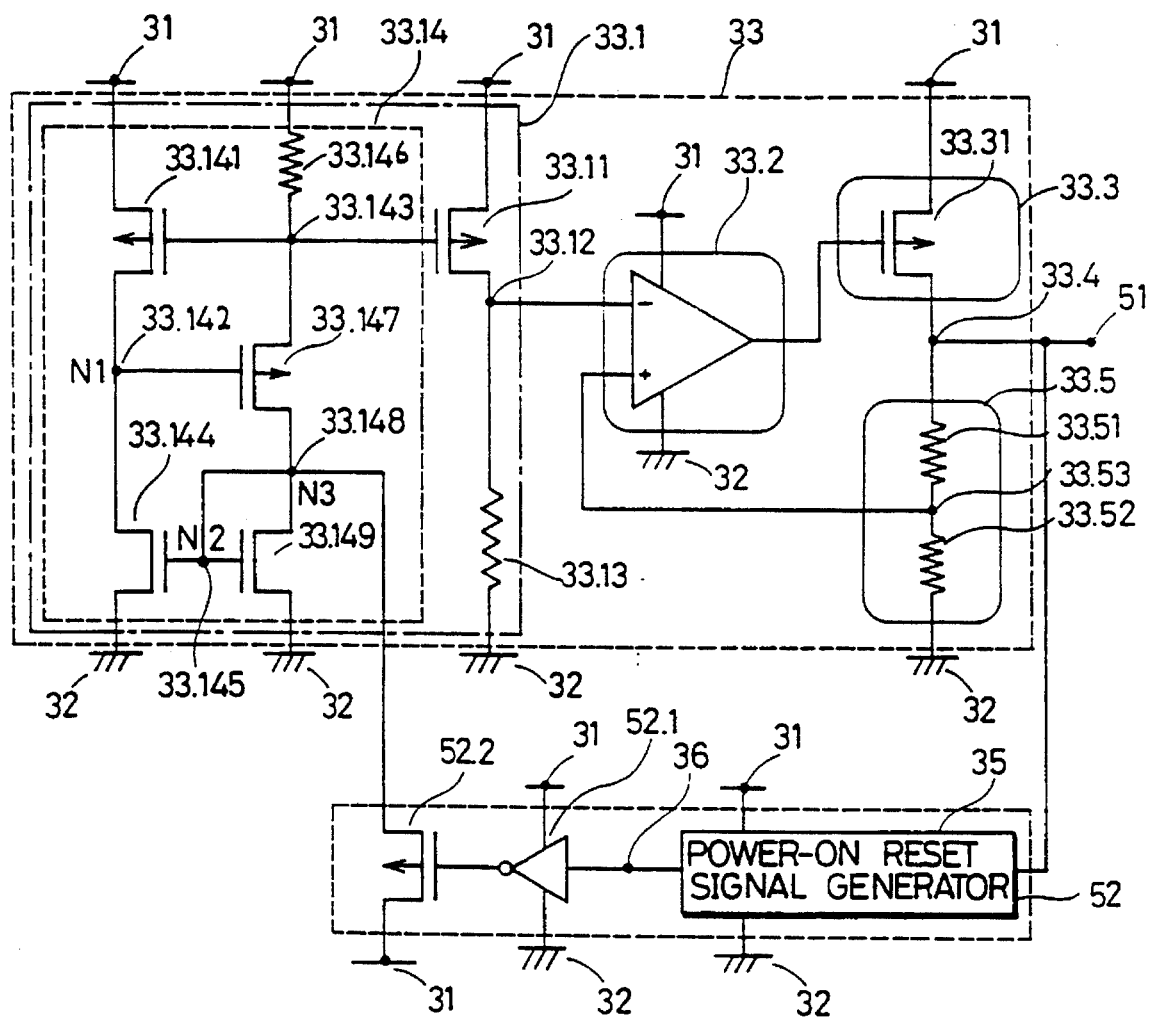
FIG. 13 is a block diagram showing an internal supply potential resetting circuit to which the inventive power-on reset signal generator is applied and an internal supply potential generation circuit.

FIG. 13 is a circuit diagram showing an internal supply potential resetting circuit 52, to which a power-on reset signal generator 35 according to the first or second embodiment is applied, and an internal supply potential generation circuit 33. According to this embodiment, the power-on reset signal generator 35 stabilizes the output of the internal supply potential generation circuit 33.

Referring to FIG. 13, the internal supply potential generation circuit 33 includes a constant potential generation circuit 33.1, a differential amplifier circuit 33.2, a driver 33.3 and a level shifter 33.5.

The constant potential generation circuit 33.1 receives an external supply potential, and outputs a constant potential. This constant potential generation circuit 33.1 includes a p-channel MOS transistor 33.11, a first resistor 33.13 and a feedback circuit 33.14. The p-channel MOS transistor 33.11 has a source which is connected to an external supply potential node 31 and a drain which is connected to a constant potential output node 33.12 for outputting the constant potential. The first resistor 33.13 is connected between the constant potential output node 33.12 and a ground potential node 32.

The feedback circuit 33.14 receives the external supply potential, and supplies a gate potential to the p-channel MOS transistor 33.11. This feedback circuit 33.14 fluctuates the gate potential of the p-channel MOS transistor 33.11 to make a current flowing across the external supply potential node 31 and the constant potential output node 33.12 constant so that the constant potential output node 33.12 outputs a constant potential when the external supply potential is fluctuated.

The feedback circuit 33.14 includes a p-channel MOS transistor 33.141, an n-channel MOS transistor 33.144, a second resistor 33.146, a p-channel MOS transistor 33.147 and an n-channel MOS transistor 33.149.

The p-channel MOS transistor 33.141 has a source which is connected to the external supply potential node 31, a drain which is connected to the first node 33.142, and a gate which is connected to an output node 33.143. The n-channel MOS transistor 33.144 has a drain which is connected to the first node 33.142, a source which is connected to the ground potential node 32, and a gate which is connected to a second node 33.145. The second resistor 33.146 is connected between the external supply potential node 31 and the output node 33.143. The p-channel MOS transistor 33.147 has a source which is connected to the output node 33.143, a drain which is connected to a third node 33.148 being connected to the second node 33.145, and a gate which is connected to the first node 33.142. The n-channel MOS transistor 33.149 has a drain which is connected to the third node 33.148, a source which is connected to the ground potential node 32, and a gate which is connected to the third node 33.148 and the second node 33.145 being connected to the gate of the n-channel MOS transistor 33.144. The n-channel MOS transistors 33.144 and 33.149 form a current mirror circuit.

The differential amplifier circuit 33.2, which is driven by the external supply potential, receives the constant potential outputted from the constant potential generation circuit 33.1 in its negative-phase input end, and outputs a potential obtained by multiplying difference between potentials of positive- and negative-phase input ends by a differential gain.

The driver 33.3 includes a p-channel transistor 33.31 having a source which is connected to the external supply potential node 31, a drain which is connected to an internal potential node 33.4 being connected to an internal supply potential output end 51 for outputting the internal supply potential, and a gate which is connected to the output end of the differential amplifier circuit 33.2. This driver 33.3 makes a current flowing across the external supply potential node 31 and the internal potential node 33.4 constant so that the internal supply potential is constant even if the external supply potential is fluctuated.

The level shifter 33.5 includes third and fourth resistors 33.51 and 33.52 which are connected in series between the internal potential node 33.4 and the ground potential node 32. The potential of a level shift node 33.53 provided between the third and fourth resistors 33.51 and 33.52 is supplied to a positive-phase input end of the differential amplifier circuit 33.2.

The internal supply potential resetting circuit 52 includes the power-on reset signal generator 35 according to the first or second embodiment, an inverter 52.1 and a p-channel MOS transistor 52.2.

This internal supply potential resetting circuit 52 receives the external supply potential and the internal supply potential outputted by the internal supply potential generation circuit 33, and increases the potential of the third node 33.148 provided in the first feedback circuit 33.14 of the constant potential generation circuit 33.1, in order to reset the internal supply potential to the third level (3.3 V) when the internal supply potential substantially reaches the ground level although the external supply potential is at the first level (5.0 V).

The inverter 52.1, which is driven by the external supply potential, receives the power-on reset signal outputted from the power-on reset signal generator 35 to a POR output node 36, and outputs an inverted signal of the power-on reset signal.

The p-channel MOS transistor 52.2 has a source which is connected to the external supply potential node 31, a drain which is connected to the third node 33.148 in the feedback circuit 33.14 of the constant potential generation circuit 33.1, and a gate which is connected to the output end of the inverter 52.1.

The operations of the internal supply potential generation circuit 33 and the internal supply potential resetting circuit 52 according to the fourth embodiment are now described.

When a sufficient time elapses after the external supply potential supplied to the external supply potential node 31 reaches the first level (5.0 V), the negative-phase input end of the differential amplifier 33.2 is supplied with the constant potential from the constant potential generation circuit 33.1, and its positive-phase input end is supplied with a potential which is slightly higher than this constant potential from the level shift node 33.53 of the level shifter 33.5.

The differential amplifier circuit 33.2 outputs a potential obtained by multiplying the difference between the potential received from the level shift node 33.53 and the constant potential received from the constant potential generation circuit 33.1 by a differential gain to the gate of the p-channel MOS transistor 33.31 provided in the driver 33.3. Thus, the degree of conduction of the p-channel MOS transistor 33.31 is so controlled that a constant current flows across the external supply potential node 31 and the internal potential node 33.4. Therefore, a constant potential appears at the internal potential node 33.4 which is connected to the internal supply potential output end 51.

When the external supply potential exceeds 5.0 V, for example, the potential of the internal potential node 33.4 which is connected to the internal supply potential output end 51 exceeds 3.3 V. Thus, the potential of the level shift node 33.53 of the level shifter 33.5 which is connected to the positive-phase input end of the differential amplifier circuit 33.2 is also increased. Consequently, the output potential of the differential amplifier circuit 33.2 is also increased, whereby the degree of conduction of the p-channel MOS transistor 33.31 is reduced, i.e., the resistance value is increased. Thus, the current flowing across the external supply potential node 31 and the internal potential node 33.4 is reduced so that the potential of the internal potential node 33.4 is reduced to 3.3 V.

When the external supply potential is reduced below 5.0 V, on the other hand, the potential of the internal potential node 33.4 which is connected to the internal supply potential output end 51 is reduced below 3.3 V. Thus, the potential of the level shift node 33.53 of the level shifter 33.5 which is connected to the positive-phase input end of the differential amplifier circuit 33.2 is also reduced. Consequently, the output potential of the differential amplifier circuit 33.2 is also reduced, whereby the degree of conduction of the p-channel MOS transistor 33.31 is increased, i.e., the resistance value is reduced. Thus, the current flowing across the external supply potential node 31 and the internal potential node 33.4 is increased so that the potential of the internal potential node 33.4 is increased to 3.3 V.

When the potential of 3.3 V serving as the internal potential is outputted to the internal supply potential output end 51 in the aforementioned manner, the output from the power-on reset signal generator 35 goes low and the output of the inverter 52.1 goes high. Thus, the p-channel MOS transistor 52.2 is in a non-conductive state. Therefore, the internal supply potential resetting circuit 52 exerts no influence on the feedback circuit 33.14.

It is assumed here that the potential of the first node 33.142 of the feedback circuit 33.14 is increased by a noise or the like. In this case, the p-channel MOS transistor 33.147 whose gate is connected to the first node 33.142 is turned off, whereby the potentials of the second and third nodes 33.145 and 33.148 substantially reach the ground level through the n-channel MOS transistor 33.149. Thus, the n-channel MOS transistors 33.144 and 33.149 are turned off. Since the p-channel MOS transistor 33.147 is turned off, the potential of the output node 33.143 becomes equal to the external supply potential.

As the result, the p-channel MOS transistors 33.141 and 33.11 whose gates are connected to the output node 33.143 are turned off, and the potential of the constant potential output node 33.12 which is connected to the negative-phase input end of the differential amplifier circuit 33.2 reaches the ground level. Thus, the output potential of the differential amplifier circuit 33.2 is increased, and the p-channel MOS transistor 33.31 receiving this output potential in its gate is turned off. Therefore, the potential of the internal potential node 33.4 which is connected to the internal supply potential output end 51 reaches the ground level.

If the output end of the internal supply potential resetting circuit 52 is not connected to the third node 33.148 of the feedback circuit 33.14 provided in the constant potential generation circuit 33.1, the internal supply potential is inevitably stabilized at the ground level and not increased to 3.3 V until the external supply potential is temporarily interrupted and again supplied.

According to the fourth embodiment, however, the output end of the internal supply potential resetting circuit 52 is connected to the third node 33.148 of the feedback circuit 33.14 provided in the constant potential generation circuit 33.1. When the internal supply potential substantially reaches the ground level, therefore, the power-on reset signal which is outputted to the POR output node 36 by the power-on reset signal generator 35 provided in the internal supply potential resetting circuit 52 rises. Thus, the gate potential of the p-channel MOS transistor 52.2 is reduced by the inverter 52.1 to a low level.

Consequently, the p-channel MOS transistor 52.2 is turned on to electrically connect the external supply potential node 31 with the third node 33.148 of the feedback circuit 33.14. Therefore, the potential of the third node 33.148 which is connected to the gates of the n-channel MOS transistors 33.144 and 33.149 is increased to turn on the n-channel MOS transistors 33.144 and 33.149. Thus, the first node 33.142 is electrically connected with the ground potential node 32. Therefore, the potential of the first node 33.142 which is connected to the gate of the p-channel MOS transistor 33.147 is reduced from the level increased by the noise or the like.

The p-channel MOS transistor 33.147 is turned on since the potential of the first node 33.142 goes low. Thus, the potential of the output node 33.143 is reduced from the external supply potential toward the ground potential through the p-channel MOS transistor 33.147 and the n-channel MOS transistor 33.149. Consequently, the p-channel MOS transistors 33.141 and 33.11 are turned on and the constant potential generation circuit 33.14 starts to output the constant potential. Thus, the internal supply potential is reset.

According to the fourth embodiment, as hereinabove described, the power-on reset signal outputted from the power-on reset signal generator 35 rises in the internal supply potential resetting circuit 52 so that the potential of the third node 33.148 is increased and that of the first node 33.142 is reduced even if the potential of the first node 33.142 of the feedback circuit 33.14 is so increased by a noise or the like that the potential of the third node 33.148 and the internal supply potential substantially reach the ground level. Therefore, it is possible to reset the internal supply potential without interrupting the external supply potential.

(5) Fifth Embodiment

Figure 14A:
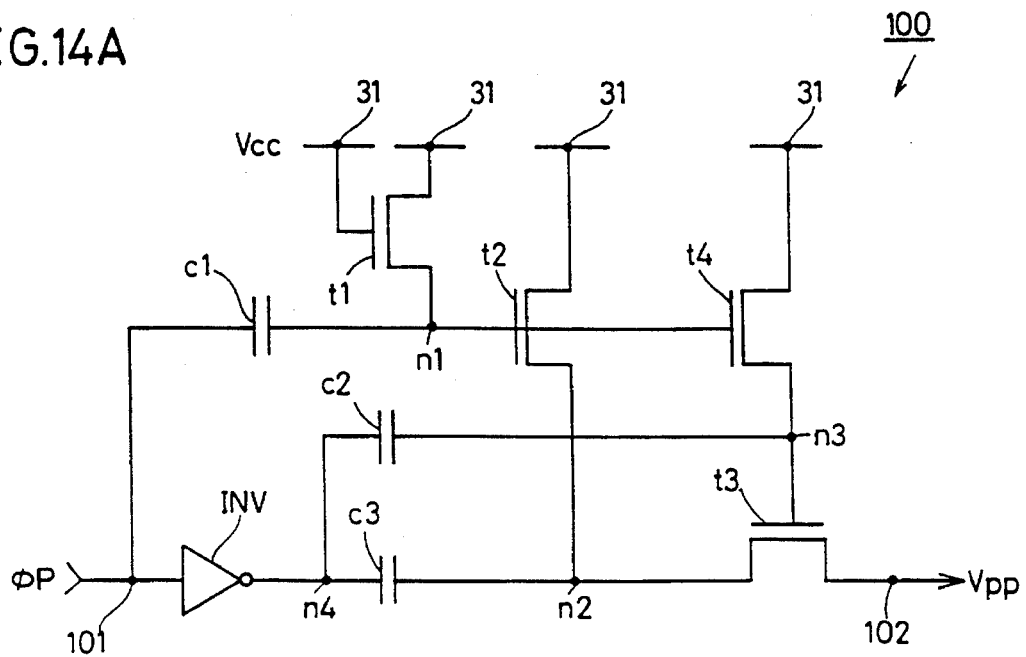
FIG. 14A is a circuit diagram showing another example of the internal supply potential generation circuit.
Figure 14B:
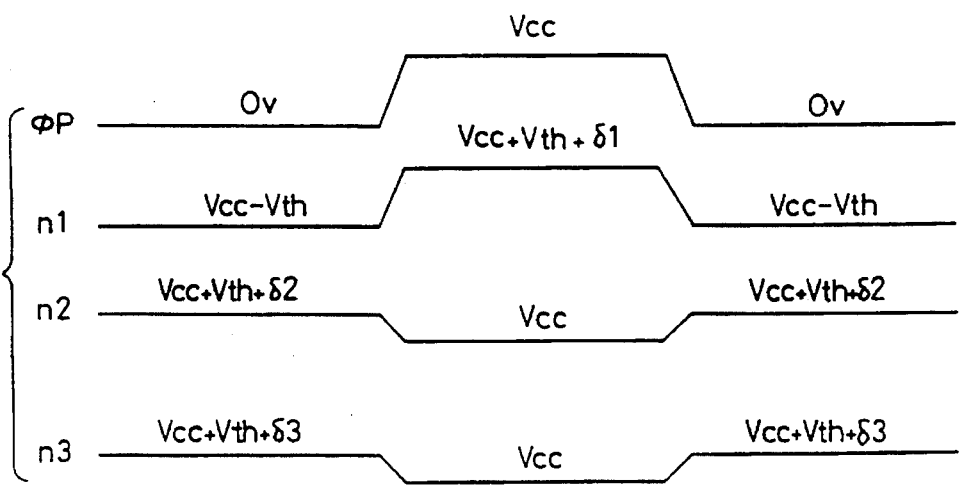
FIG. 14B is a waveform diagram showing operation timing of the internal supply potential generation circuit shown in FIG. 14A.
Figure 15:
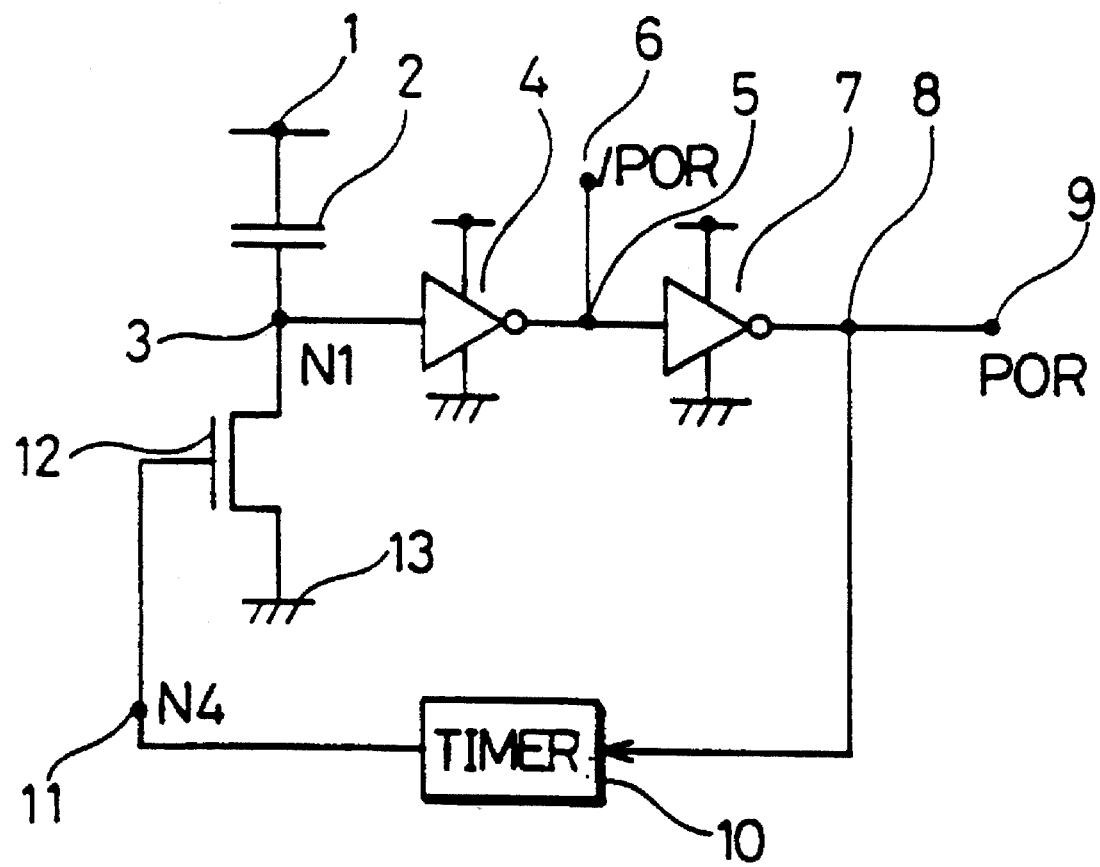
FIG. 15 is a circuit diagram showing a conventional power-on reset signal generator.
Figure 16:
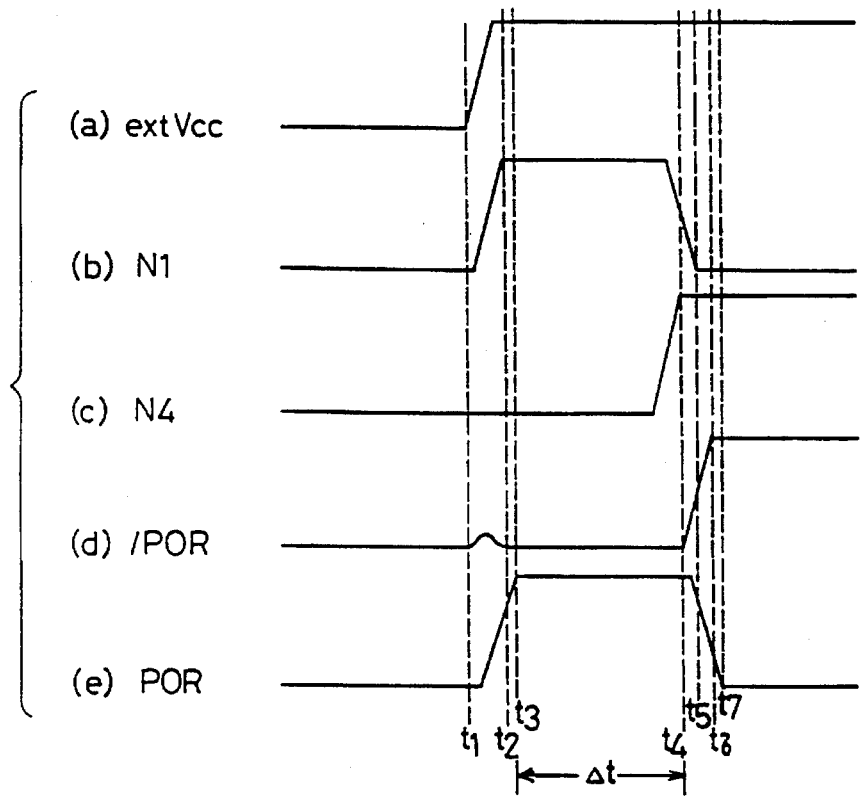
FIG. 16 is a timing chart showing operation timing of the conventional power-on reset signal generator.

FIG. 14A is a circuit diagram showing another example of the internal supply potential generation circuit. FIG. 14B is a waveform diagram showing operation timing of the internal supply potential generation circuit shown in FIG. 14A.

An internal supply potential generation circuit 100 shown in FIG. 14A generates an internal supply potential Vpp which is higher than an external supply potential Vcc. The power-on reset signal generator 35 according to the first or second embodiment can also be applied to the internal supply potential generation circuit 100 shown in FIG. 14A.

The internal supply potential Vpp generated by the internal supply potential generation circuit 100 is supplied to the gate of an n-channel MOS transistor for driving a word line, for example. When the word line is driven, therefore, its potential is increased to the external supply potential Vcc. Namely, the threshold voltage of the n-channel MOS transistor is compensated.

Referring to FIG. 14A, the internal supply potential generation circuit 100 includes n-channel MOS transistors t1, t2, t3 and t4, capacitors c1, c2 and c3 and an inverter INV.

The transistor t1 is connected between an external supply potential node 31 receiving the external supply potential Vcc and a node n1, and its gate is connected to the external supply potential node 31. The transistor t2 is connected between the external supply potential node 31 and a node n2, and its gate is connected to the node n1. The transistor t4 is connected between the external supply potential node 31 and a node n3, and its gate is connected to the node n1. The transistor t3 is connected between the node n2 and an internal potential node 102 for outputting the internal supply potential Vpp, and its gate is connected to the node n3.

The capacitor c1 is connected between a pulse node 101 receiving a periodic pulse signal $\phi$p and the node n1. The inverter INV is connected between the pulse node 101 and a node n4. The capacitor c2 is connected between the nodes n4 and n3. The capacitor c3 is connected between the nodes n4 and n2.

The pulse signal $\phi$p, which is generated in the interior of the chip, has a frequency of 10 MHz, for example. The external supply potential Vcc is 5.0 V, for example.

The operation of the internal supply potential generation circuit 100 shown in FIG. 14A is now described with reference to the waveform diagram shown in FIG. 14B.

Referring to FIG. 14B, symbol Vth denotes the threshold voltage of the transistors t1, t2 and t4, and symbols $\delta 1$, $\delta 2$ and $\delta 3$ denote values which are determined by parameters.

When the pulse signal $\phi$p is 0 V, the potential of the node n1 is Vcc−Vth. When the pulse signal $\phi$p rises from 0 V to the external supply potential Vcc, the potential of the node n1 theoretically becomes 2Vcc−Vth by capacitance coupling of the capacitor c1. In practice, however, the potential of the node n1 is not increased to 2Vcc−Vth due to parasitic capacitance. The parameter is so set here that the potential of the node n1 reaches a level exceeding Vcc+Vth, i.e., Vcc+Vth+$\delta 1$.

Since the potential of the node n1 is higher than Vcc+Vth, the transistors t2 and t4 are turned on. Consequently, the potentials of the nodes n2 and n3 reach the external supply potential Vcc.

When the pulse signal φp falls from the external supply potential Vcc to 0 V, on the other hand, the transistors t2 and t4 are turned off. Further, the potential of the node n4 rises to the external supply potential Vcc. Thus, the potentials of the nodes n2 and n3 theoretically become 2Vcc−Vth, by capacitive coupling of the capacitors c3 and c2. In practice, however, the potentials of the nodes n2 and n3 are not increased to 2Vcc−Vth due to parasitic capacitance. The parameters are so set here that the potentials of the nodes n2 and n3 reach levels higher than Vcc+Vth, i.e., Vcc+Vth+δ2 and Vcc+Vth+δ3 respectively.

Consequently, the transistor t3 is turned on. Thus, the potential of the internal potential node 102 is increased. The aforementioned operation is so repeated that the internal supply potential Vpp finally converges to the potential (Vcc+Vth+δ2) of the node n2.

The internal potential node 102 of the internal supply potential generation circuit 100 is connected to the internal potential node 35.32 of the power-on reset signal generator 35 shown in FIG. 1 or 8.

When the inventive power-on reset signal generator 35 is applied to the internal supply potential generation circuit 100 generating the internal supply potential which is higher than the external supply potential, an effect similar to that of the first or second embodiment is attained.

Although the present invention has been described and illustrated in detail, it is Clearly understood that the same is by way of illustration and example only and is not to be taken by way of limitation, the spirit and scope of the present invention being limited only by the terms of the appended claims.

What is claimed is:

1. A power-on reset signal generator for a semiconductor integrated circuit device including internal supply potential generation means receiving an external supply potential for generating an internal supply potential and an internal circuit receiving said internal supply potential from said internal supply potential generation means, said power-on reset signal generator comprising:

first signal generation means receiving said external supply potential for generating a signal which changes, after an elapse of a prescribed time from a start time of change of said external supply potential from the ground level to a first level, from the ground level to a second level; and second signal generation means receiving said internal supply potential from said internal supply potential generation means and said signal from said first signal generation means for generating a power-on reset signal, said second signal generation means activating said power-on reset signal in response to said change of said external supply potential from the ground level to said first level and inactivating said power-on reset signal in response to reaching of said signal from said first signal generation means to a first prescribed level and reaching of said internal supply potential to a second prescribed level.

2. A power-on reset signal generator in accordance with claim 1, wherein said first signal generation means includes:

capacitance means being connected between a supply potential node receiving said external supply potential and a first node, first inversion means for inverting the logical level of the potential of an output first node and outputting said signal to a second node, second inversion means for inverting the output signal from said first inversion means, delay means for delaying an output signal from said second inversion means, and discharge means for discharging said first node in response to an output signal from said delay means.

3. A power-on reset signal generator in accordance with claim 1, wherein said second signal generation means includes:

level detection means receiving said internal supply potential from said internal supply potential generation means for detecting said reaching of said internal supply potential to said second prescribed level to generate a detection signal, and logic means being driven by said external supply potential for generating said power-on reset signal in response to said signal from said first signal generation means and said detection signal from said level detection means, said logic means activating said power-on reset signal in response to said change of said external supply potential from the ground level to said first level and inactivating said power-on reset signal in response to said reaching of said signal from said first signal generation means to said first prescribed level and said detection signal.

4. A power-on reset signal generator in accordance with claim 3, wherein said level detection means includes:

reference voltage generation means receiving said external supply potential for generating a reference potential of a prescribed level, and compare means for comparing said internal supply potential with said reference potential to output a signal based on difference between said internal supply potential and said reference potential as a detection signal.

5. A power-on reset signal generator in accordance with claim 4, wherein said compare means includes a differential amplifier circuit.

6. A power-on reset signal generator in accordance with claim 4, wherein said reference potential generation means includes:

load means being connected between an external supply potential node receiving said external supply potential and an output node outputting said reference potential, and a plurality of field effect transistors being connected in series between said output node and a ground potential node receiving the ground potential.

7. A power-on reset signal generator in accordance with claim 3, wherein said logic means includes a NAND gate.

8. A power-on reset signal generator in accordance with claim 3, wherein said second signal generation means further includes:

delay means for delaying said detection signal from said level detection means and supplying the delayed detection signal to said logic means.

9. A power-on reset signal generator in accordance with claim 8, wherein said delay means includes:

a plurality of inverters being connected in series between a node receiving said detection signal and a node outputting said delayed detection signal, and a plurality of capacitance means being connected between a plurality of nodes between said plurality of inverters and a ground potential node receiving the ground potential.

10. A power-on reset signal generator in accordance with claim 1, wherein said internal supply potential is lower than said first level.

11. A power-on reset signal generator in accordance with claim 1, wherein said internal supply potential is higher than said first level.

12. A power-on reset signal generator for a semiconductor integrated circuit including internal supply potential generation means receiving an external supply potential for generating an internal supply potential and an internal circuit receiving said internal supply potential from said internal supply potential generation means, said power-on reset signal generator comprising:

first signal generation means receiving said external supply potential for generating a signal which changes, after an elapse of a prescribed time from a start time of rise of said external supply potential from the ground level to a first level, from the ground level to a second level; and second signal generation means receiving said internal supply potential from said internal supply potential generation means and said signal from said first signal generation means for generating a power-on reset signal rising in response to said rise of said external supply potential from the ground level to said first level and falling in response to exceeding of said signal from said first signal generation means beyond a first prescribed level and exceeding of said internal supply potential from said internal supply potential generation means beyond a second prescribed level.

13. A power-on reset signal generator in accordance with claim 12, wherein said internal supply potential is lower than said first level.

14. A power-on reset signal generator in accordance with claim 12, wherein said internal supply potential is higher than said first level.

15. A semiconductor integrated circuit formed on a substrate, comprising:

internal supply potential generation means receiving an external supply potential for generating an internal supply potential;

power-on reset signal generation means receiving said external supply potential and said internal supply potential for generating a power-on reset signal; and substrate ground means coupled to said substrate for bringing said substrate to the ground potential in response to said power-on reset signal from said power-on reset signal generation means, said power-on reset signal generation means including:

first signal generation means receiving said external supply potential for generating a signal which changes, after an elapse of a prescribed time from a start time of change of said external supply potential from the ground level to a first level, from the ground level to a second level, and second signal generation means receiving said internal supply potential from said internal supply potential generation means and said signal from said first signal generation means for generating said power-on reset signal, said second signal generation means activating said power-on reset signal in response to said change of said external supply potential from the ground level to said first level and inactivating said power-on reset signal in response to reaching of said signal from said first signal generation means to a first prescribed level and reaching of said internal supply potential to a second prescribed level.

16. A semiconductor integrated circuit in accordance with claim 15, wherein said substrate ground means includes:

capacitance means being connected between an external supply potential node receiving said external supply potential and a prescribed node, discharge means being connected between said substrate and a ground potential node receiving the ground potential and entering a conductive state in response to change of the potential of said prescribed node from the ground level to said first level, and transfer means being connected between said substrate and said prescribed node for entering a non-conductive state in activation of said power-on reset signal and entering a conductive state in inactivation of said power-on reset signal.

17. A semiconductor integrated circuit in accordance with claim 15, further including:

back gate potential generation means for generating a predetermined back gate potential and supplying the same to said substrate.

18. A semiconductor integrated circuit comprising:

internal supply potential generation means receiving an external supply potential and for generating an internal supply potential, said internal supply potential generation means including a reference potential generation means for generating a constant reference potential;

power-on reset signal generation means receiving said external supply potential and said internal supply potential for generating a power-on reset signal, said power-on reset signal generation means activating said power-on reset signal, when said internal supply potential drops below a threshold potential; and resetting means for resetting said reference potential generation means to said constant reference potential in response to said power-on reset signal.

19. A semiconductor integrated circuit comprising:

internal supply potential generation means receiving an external supply potential and for generating an internal supply potential;

power-on reset signal generation means receiving said external supply potential and said internal supply potential for generating a power-on reset signal, said power-on reset signal generation means activating said power-on reset signal when said internal supply potential drops below a threshold potential; and resetting means for resetting said internal supply potential to said prescribed level in response to said power-on reset signal wherein said internal supply potential generation means includes reference potential generation means for generating a reference potential, said reference potential generation means including:

a first first conductive channel type field effect transistor being connected between an external supply potential node receiving said external supply potential and a first node and having a gate receiving the potential of a second node, load means being connected between said external supply potential node and said second node, a second first conductive channel type field effect transistor being connected between said second node and a third node and having a gate receiving the potential of said first node, a first second conductive channel type field effect transistor being connected between said first node and a ground potential node receiving the ground potential and having a gate receiving the potential of said third node, and a second second conductive channel type field effect transistor being connected between said third node and said ground potential node and having a gate receiving the potential of said third node, said resetting means including:

charge means for charging said third node of said reference potential generation means at said external supply potential in response to activation of said power-on reset signal.

20. A semiconductor integrated circuit in accordance with claim 19, wherein said power-on reset signal generation means includes:

first signal generation means receiving said external supply potential for generating a signal which changes, after an elapse of a prescribed time from a start time of change of said external supply potential from the ground level to a first level, from the ground level to a second level, and second signal generation means receiving said internal supply potential from said internal supply potential generation means and said signal from said first signal generation means for generating said power-on reset signal, said second signal generation means activating said power-on reset signal in response to said change of said external supply potential from the ground level to said first level and inactivating said power-on reset signal in response to reaching of said signal from said first signal generation means to a first prescribed level and reaching of said internal supply potential to a second prescribed level.

21. A semiconductor integrated circuit in accordance with claim 19, wherein said charge means includes:

a field effect transistor being connected between said third node and said external supply potential node and having a gate responding to said power-on reset signal.

22. An operating method of an apparatus for generating a power-on reset signal for a semiconductor integrated circuit including internal supply potential generation means receiving an external supply potential having either a rapid or a slow rise time for generating an internal supply potential having a predetermined rise time lower than said rapid rise time of said external supply and an internal circuit receiving said internal supply potential from said internal supply potential generation means, said method including the steps of:

activating said power-on reset signal in response to change of said external supply potential from the ground level to a first level;

generating a delay signal being changed from the ground level to a second level after a lapse of a prescribed time from a start time of said change of said external supply potential from the ground level to said first level; and inactivating said power-on reset signal in response to reaching of said delay signal to a first prescribed level and reaching of said internal supply potential having said predetermined rise time to a second prescribed level.

23. A semiconductor integrated circuit comprising:

internal power supply potential generation means receiving an external supply potential and for generating an internal power supply potential, wherein said internal power supply potential is employed in an internal circuit including a memory cell array, said internal power supply potential generation means including a reference potential generation means for generating a constant reference potential;

power-on reset signal generation means receiving said external supply potential and said internal power supply potential for generating a power-on reset signal, said power-on reset signal generation means activating said power-on reset signal when said internal power supply potential drops below a threshold potential; and resetting means for resetting said reference potential generation means to said constant reference potential in response to said power-on reset signal.

* * * * *